United States Patent
Lee et al.

(10) Patent No.: US 12,446,401 B2
(45) Date of Patent: Oct. 14, 2025

(54) CIRCUIT ELEMENT CONNECTION PATTERN AND ELECTRONIC DEVICE HAVING THE SAME

(71) Applicant: Samsung Display Co., Ltd., Yongin-si (KR)

(72) Inventors: Seungchan Lee, Hwaseong-si (KR); In-Bae Kim, Daejeon (KR); Jaechung Kim, Goyang-si (KR); Seongjun Lee, Seoul (KR); Jaeik Lim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 457 days.

(21) Appl. No.: 17/836,152

(22) Filed: Jun. 9, 2022

(65) Prior Publication Data
US 2023/0107292 A1    Apr. 6, 2023

(30) Foreign Application Priority Data
Sep. 30, 2021   (KR) ........................ 10-2021-0130016

(51) Int. Cl.
*H10K 59/121*    (2023.01)
*H10K 59/131*    (2023.01)
*H10K 102/00*    (2023.01)

(52) U.S. Cl.
CPC ..... *H10K 59/1213* (2023.02); *H10K 59/1216* (2023.02); *H10K 59/131* (2023.02); *H10K 2102/311* (2023.02)

(58) Field of Classification Search
CPC ............ H01K 59/131; H01K 59/1213; H01K 59/1216; H10K 2102/311; H10K 77/111; H10D 86/441; H10D 86/60
(Continued)

(56) References Cited

U.S. PATENT DOCUMENTS 7,902,602 B2    3/2011   Koo et al.
11,538,879 B2   12/2022  Kim et al.
(Continued)

FOREIGN PATENT DOCUMENTS

KR    10-0560796 B1    3/2006
KR    10-1400284 B1    5/2014
(Continued)

*Primary Examiner* — Eva Y Montalvo
*Assistant Examiner* — Jiyoung Oh
(74) *Attorney, Agent, or Firm* — CANTOR COLBURN LLP

(57) ABSTRACT

A display panel includes a folding axis about which the display panel is foldable, a circuit element layer which is foldable about the folding axis, the circuit element layer including a first transistor including a first semiconductor pattern, a second transistor electrically connected to the first transistor and including a second semiconductor pattern, and the first semiconductor pattern and the second semiconductor pattern on the same layer of the circuit element layer, and a connection pattern which connects the first semiconductor pattern and the second semiconductor pattern to each other, and is on a different layer of the circuit element layer from the same layer on which the first semiconductor pattern and the second semiconductor pattern are disposed, and a light emission element connected to the circuit element layer.

18 Claims, 20 Drawing Sheets

(58) Field of Classification Search
USPC .......................................................... 257/30
See application file for complete search history.

(56) References Cited

U.S. PATENT DOCUMENTS

| | | | |
|---|---|---|---|
| 2008/0253073 | A1 | 10/2008 | Kee et al. |
| 2018/0061914 | A1* | 3/2018 | Jeong ................... H10K 59/35 |
| 2020/0273941 | A1 | 8/2020 | Cha et al. |
| 2021/0241689 | A1* | 8/2021 | Lee ..................... G09G 3/3233 |

FOREIGN PATENT DOCUMENTS

| | | |
|---|---|---|
| KR | 20160065300 A | 6/2016 |
| KR | 20180023155 A | 3/2018 |
| KR | 1020200104972 A | 9/2020 |
| KR | 10-2171322 B1 | 10/2020 |
| KR | 20210103015 A | 8/2021 |

* cited by examiner

CIRCUIT ELEMENT CONNECTION PATTERN AND ELECTRONIC DEVICE HAVING THE SAME

This application claims priority under 35 U.S.C. § 119 of Korean Patent Application No. 10-2021-0130016, filed on Sep. 30, 2021, the entire contents of which are hereby incorporated by reference.

BACKGROUND

(1) Field

The present disclosure herein relates to a display panel, and more specifically to, a flexible display panel.

(2) Description of the Related Art

Multimedia electronic devices such as televisions, mobile phones, tablet computers, navigation system units, and game consoles may be equipped with a display device for displaying images. The display device may be equipped with a display panel for generating images and providing the generated images to outside the display device through a display screen of the display device. The display panel may include a plurality of pixels which generate images, and a driver which drives the pixels.

With the development of technologies, a flexible display device including a flexible display panel is being developed. For example, various flexible display devices which may be deformed into a shape having a curved surface, folded, or rolled are being developed. The flexible display device which may be deformed into various shapes is easy to carry and may improve a convenience of using thereof.

SUMMARY

A flexible display device including a flexible display panel may be vulnerable to impacts. For example, transistors of the display panel may be damaged by external impacts to the display device or by stress caused by deforming (e.g., folding) of the display device, so that pixels of the display panel may not operate normally.

The present disclosure herein provides a pixel which may prevent damage to transistors within the pixel which is caused by external impacts, and a display panel including the same.

An embodiment of the invention provides a display panel being foldable about a folding axis and including a circuit element layer on the base substrate and including a plurality of transistors and at least one connection pattern which is configured to connect two transistors among the plurality of transistors to each other, and a light emission element on the circuit element layer and including an anode and a cathode. The plurality of transistors includes a first transistor including a first semiconductor pattern, a second transistor including a second semiconductor pattern, and the first semiconductor pattern and the second semiconductor pattern on the same layer. The connection pattern is on a different layer from a layer on which the first semiconductor pattern is disposed, and the connection pattern connects the first semiconductor pattern and the second semiconductor pattern to each other.

In an embodiment, the connection pattern may include molybdenum, aluminum, copper or an alloy thereof.

In an embodiment, the circuit element layer may further include a capacitor, where the capacitor may include a first electrode on the first semiconductor pattern and a second electrode on the first electrode, and the connection pattern may be on a different layer from layers on which the first electrode and the second electrode are disposed.

In an embodiment, the first electrode may include a first portion overlapping the first semiconductor pattern to define a gate electrode of the first transistor, and a second portion overlapping the second electrode.

In an embodiment, the plurality of transistors may include a third transistor including a third semiconductor pattern on a different layer from a layer on which the first semiconductor pattern is disposed.

In an embodiment, the circuit element layer may further include a connection electrode which is electrically connected to a source of the third semiconductor pattern and a gate electrode of the first transistor.

In an embodiment, the connection pattern and the connection electrode may be on the same layer.

In an embodiment, the connection pattern may be on a different layer from a layer on which the connection electrode is disposed.

In an embodiment, the connection electrode may overlap an entire region of the source of the third semiconductor pattern in a plan view.

In an embodiment, the third transistor may include a gate electrode on the third semiconductor pattern, and the connection pattern and the gate electrode of the third transistor may be on the same layer.

In an embodiment, the circuit element layer may include a signal line connected to the gate electrode of the third transistor, where the signal line may cross the connection pattern in a plan view.

In an embodiment, each of the first semiconductor pattern, the second semiconductor pattern and the third semiconductor pattern may include poly silicon or a metal oxide.

In an embodiment, the plurality of transistors may include a third transistor including a third semiconductor pattern and a fourth transistor including a fourth semiconductor pattern which is on the same layer as a layer on which the third semiconductor pattern is disposed, and the connection pattern may include a first connection pattern connecting to the first semiconductor pattern and the second semiconductor pattern to each other, and a second connection pattern connecting to the third semiconductor pattern and the fourth semiconductor pattern to each other.

In an embodiment, the third semiconductor pattern may be connected to the first semiconductor pattern while having an integral shape therewith, on the same layer.

In an embodiment, the circuit element layer may further include a connection electrode between the second connection pattern and the anode, and the second connection pattern may be electrically connected to the anode through the connection electrode.

In an embodiment, the circuit element layer may further include an initialization line electrically connected to the fourth transistor, and configured to receive an initialization voltage, where the initialization line may cross the second connection pattern in a plan view.

In an embodiment of the invention, a display panel includes a pixel, a scan line configured to provide a gate voltage to the pixel, a data line configured to provide a data voltage to the pixel, a first power line configured to provide a first power voltage to the pixel, and a second power line configured to provide a second power voltage to the pixel, where the pixel includes a capacitor connected to the first power line, a first transistor connected to the capacitor, a second transistor connected to the scan line and to the data line, a light emission element connected to the second power line, and a first connection pattern configured to connect the first transistor and the second transistor, where a semiconductor pattern of the first transistor and a semiconductor pattern of the second transistor are on the same layer, and the first connection pattern is on a different layer from a layer on which the semiconductor pattern of the first transistor is disposed and connects the semiconductor patterns of the first and second transistors to each other.

In an embodiment, the display panel may further include a first initialization line configured to provide a first initialization voltage to the pixel, and a first signal line configured to provide a light emission control signal to the pixel, where the pixel may further include a third transistor connected to the light emission element and to the first signal line, a fourth transistor connected to the first initialization line, and a second connection pattern configured to connect the third transistor and the fourth transistor, where a semiconductor pattern of the third transistor and a semiconductor pattern of the fourth transistor may be on the same layer, and the second connection pattern may be on a different layer from a layer on which the semiconductor pattern of the third transistor is disposed and connects the semiconductor patterns of the third and fourth transistors to each other.

In an embodiment, the display panel may further include a second initialization line configured to provide a second initialization voltage to the pixel, where the pixel may further include a fifth transistor connected to the first transistor, a sixth transistor connected to fifth transistor and to the second initialization line, a seventh transistor connected to the first power line and to the first transistor, and a connection electrode configured to connect the capacitor and the fifth transistor to each other, where the connection electrode may be on a different layer from a layer on which a semiconductor pattern of the fifth transistor is disposed, and may overlap an entire region of a source of the fifth transistor in a plan view.

In an embodiment, each of the first to the seventh transistors may be an N-type transistor or a P-type transistor.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
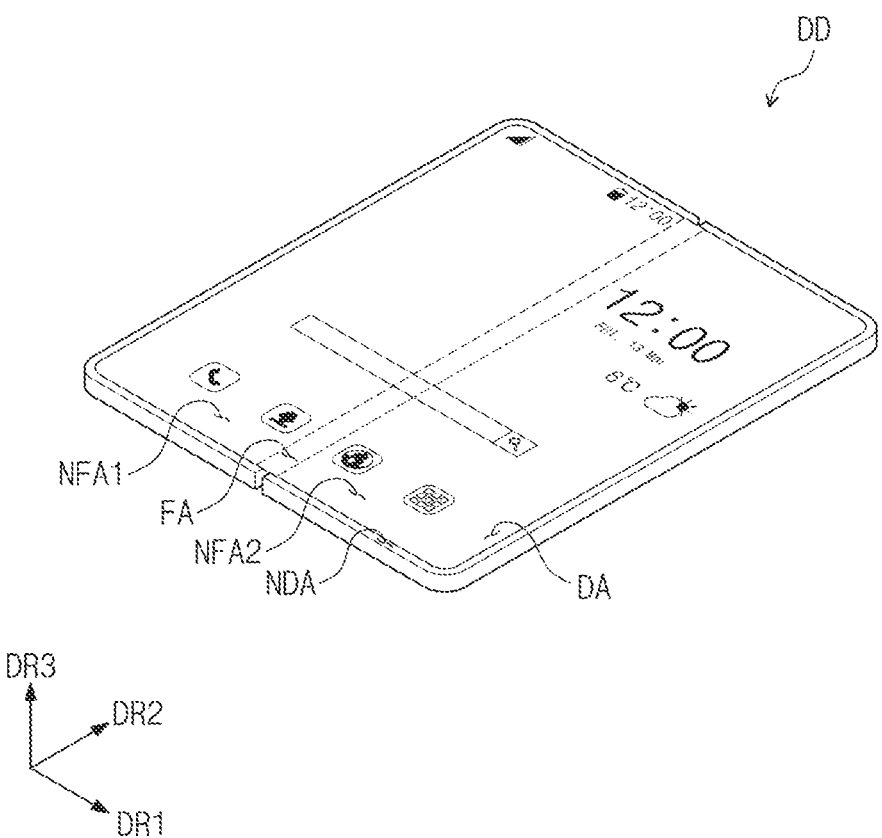
FIG. 1 is a perspective view of a display device according to an embodiment.

The invention may be modified in many alternate forms, and thus embodiments will be exemplified in the drawings and described in detail. It should be understood, however, that it is not intended to limit the invention to the particular forms disclosed, but rather, is intended to cover all modifications, equivalents, and alternatives falling within the spirit and scope of the invention.

In the present disclosure, when an element (or a region, a layer, a portion, etc.) is referred to as being related to another element such as being "on," "connected to," or "coupled to" another element, it means that the element may be directly disposed on/connected to/coupled to the other element, or that a third element may be disposed therebetween. In contrast, when an element (or a region, a layer, a portion, etc.) is referred to as being related to another element such as being "directly on," "directly connected to," or "directly coupled to" another element, it means that the element may be disposed on/connected to/coupled to the other element with no third element therebetween.

Like reference numerals refer to like elements. As used herein, a reference number may indicate a singular element or a plurality of the element. For example, a reference number labeling a singular form of an element within the drawing figures may be used to reference a plurality of the singular element within the text of specification. Also, in the drawings, the thickness, the ratio, and the dimensions of elements are exaggerated for an effective description of technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes any and all combinations of one or more of which associated elements may define.

It will be understood that, although the terms "first", "second", etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the invention. The terms of a singular form may include plural forms unless the context clearly indicates otherwise.

In addition, terms such as "below," "lower," "above," "upper," and the like are used to describe the relationship of the elements shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the invention pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a pixel PX and a display panel DP according to an embodiment will be described with reference to the accompanying drawings.

Figure 2A:
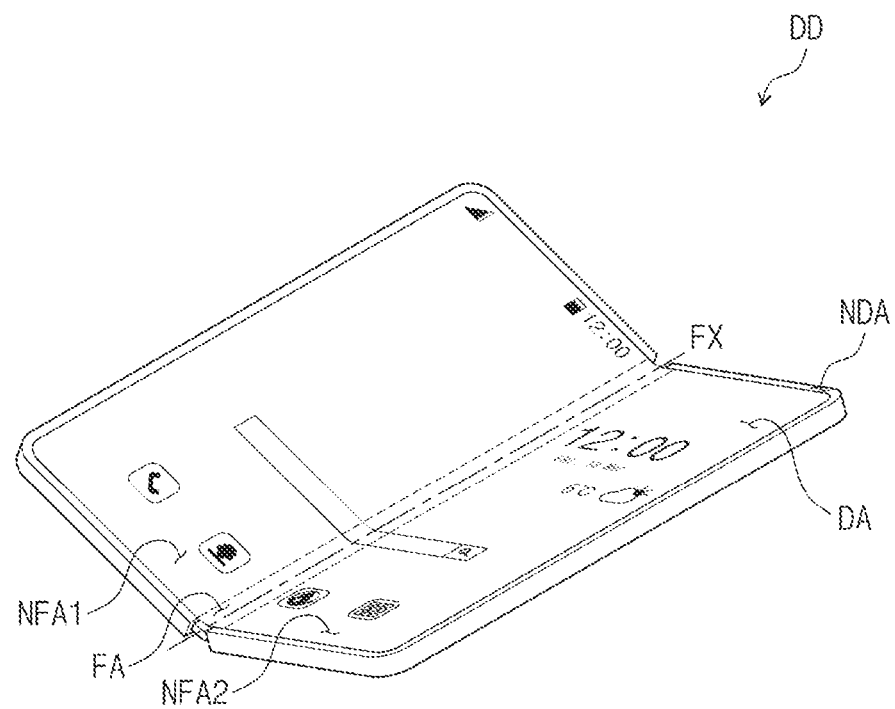
FIG. 2A and FIG. 2B are perspective views illustrating the display device which is in-folded, of an embodiment shown in FIG. 1 in an in-folded state.
Figure 2B:
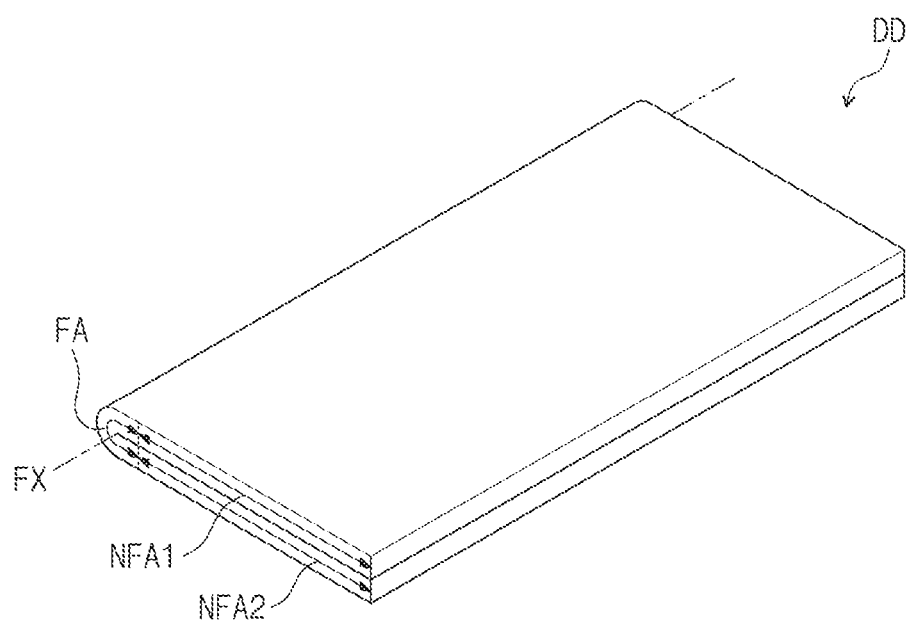
Figure 3A:
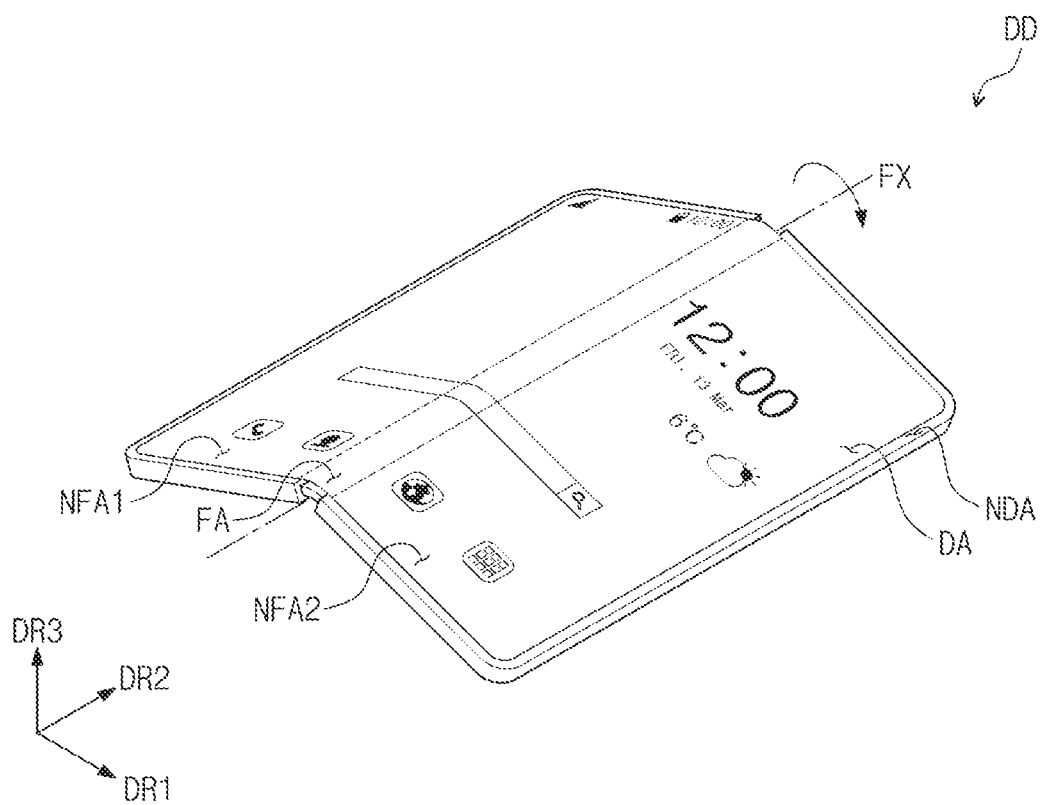
FIG. 3A and FIG. 3B are perspective views illustrating the display device which is out-folded, of an embodiment shown in FIG. 1 in an out-folded state.
Figure 3B:
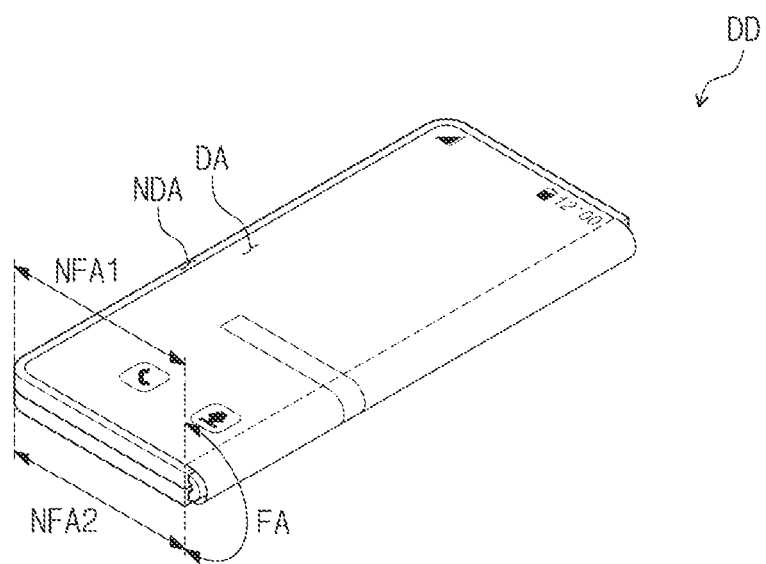
Figure 3B:
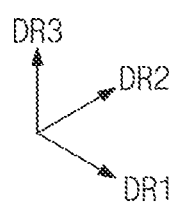

FIG. 1 is a perspective view of a display device DD according to an embodiment. FIG. 2A and FIG. 2B are perspective views illustrating the display device DD shown in FIG. 1 in an in-folded state. FIG. 3A and FIG. 3B are perspective views illustrating the display device DD shown in FIG. 1 in an out-folded state.

A display device DD may be a device which is activated according to an electrical signal and displays an image. The display device DD may be implemented as an electronic device of various embodiments. In an embodiment, for example, the display device DD may be a large-sized device such as a television and an outdoor advertisement board, as well as a small-and-medium-sized device such as a monitor, a mobile phone, a tablet computer, a navigation system unit, and a game console. Embodiments of the display device DD are exemplary, and are not limited to any one without departing from the invention. In the present embodiment, the display device DD is illustrated as a mobile phone as an example.

Referring to FIG. 1, the display device DD may be in a rectangular shape which has short sides extended in a first direction DR1 and long sides extended in a second direction DR2 which crosses the first direction DR1 on a plane (or in a plan view). However, the embodiment of the invention is not limited thereto. The display device DD may have various shapes such as a circular shape and a polygonal shape on a plane.

The display device DD of an embodiment may be flexible. The term "flexible" refers to having properties of being deformable such as being bendable, rollable, foldable, etc., and may include the display device DD from a structure which is completely folded to a structure which is bent to a degree of a few nanometers so as be less than completely folded. In an embodiment, for example, the flexible display device DD may include a curvable display device or a foldable display device. In the present embodiment, a foldable display device is illustrated as an example of the flexible display device DD.

The display device DD which is unfolded or flat (e.g., in an unfolded state) as shown in FIG. 1 may display an image in a third direction DR3 through a display surface parallel to a surface defined by the first direction DR1 and the second direction DR2 crossing each other. The third direction DR3 may be defined as a direction substantially perpendicularly crossing the surface defined by the first direction DR1 and the second direction DR2. A thickness direction of the display device DD and various components or layers thereof may be defined along the third direction DR3.

The front surface (or upper surface) and the rear surface (or lower surface) of each members (or units) constituting the display device DD may oppose each other in (or along) the third direction DR3, and the normal direction of each of the front surface and the rear surface may be substantially parallel to the third direction DR3. A separation distance between the front surface and the rear surface defined along the third direction DR3 may correspond to the thickness of a member (or unit).

In the present disclosure, "on a plane" or "in a plan view" may be defined as viewed in (or along) the third direction DR3. In the present disclosure, "on the cross-section" may be defined as viewed from the first direction DR1 or the second direction DR2, and including the third direction DR3. Directions indicated by the first to third directions DR1, DR2, and DR3 are a relative concept, and may be converted to different directions.

The front surface of display device DD may be divided into a display region DA and a non-display region NDA. The display device DD may display an image through the display region DA, and the user may visually recognize the image through the display region DA. The image may include a still image as well as a moving image. FIG. 1 illustrates a plurality of icons and a clock widget as an example of the image.

The non-display region NDA may not display an image. The non-display region NDA may be adjacent to the display region DA. In an embodiment, for example, the non-display region NDA may surround the display region DA. However, the embodiment of the invention is not limited thereto. The non-display region NDA may be adjacent to only one side of the display region DA, or may be disposed on a side surface, not on the front surface, of the display device DD. The non-display region NDA may correspond to a region in which a print layer having a color is formed, and may define the edge (or edge portion) of the display device DD.

The display device DD may include a folding region FA and a non-folding region provided in plural including a plurality of non-folding regions NFA1 and NFA2. The non-folding regions NFA1 and NFA2 may include a first non-folding region NFA1 and a second non-folding region NFA2. The first and second non-folding regions NFA1 and NFA2 may be arranged in order along the first direction DR1 with the folding region FA interposed therebetween.

The folding region FA may be flat, or may be a region which is bendable to be bent to have a curvature depending on a folding operation of the display device DD. As illustrated in FIG. 1, when the display device DD is not folded or is unfolded, the folding region FA may be flat. The non-folding regions NFA1 and NFA2 may be regions which are unfoldable and/or remain flat even in folding and non-folding states of the display device DD.

The display device DD may be folded around a folding axis FX extended along one direction. Referring to FIG. 2A and FIG. 2B, a folding axis FX may be extended along the second direction DR2 parallel to the long sides of the display device DD. However, the extension direction of the folding axis FX is not limited thereto, and the folding axis FX may be extended along a direction parallel to the short sides of the display device DD. In this case, non-folding regions may be arranged in order along the second direction DR2 with a folding region FA interposed therebetween.

The display device DD may be foldable around the folding axis FX at an angle. FIG. 2A exemplarily illustrates the display device DD which is partially folded to be in an in-folded state at an angle, and FIG. 2B exemplarily illustrates the display device DD which is completely folded to be in a completely in-folded state.

Referring to FIG. 2A, in an embodiment, the folding axis FX may be defined to face the front surface of the display device DD. A display surface corresponding to the folding region FA in the in-folded state may be foldable to form a concavely curved surface facing the folding axis FX. Portions of the display surface corresponding to the first and second non-folding regions NFA1 and NFA2 of the display device DD in the in-folded state may face each other.

Referring to FIG. 2B, in the completely in-folded state, the display surfaces corresponding to the first and second non-folding regions NFA1 and NFA2 may overlap each other while facing each other on a plane. In the completely in-folded state, the front surface of the display device DD may not be exposed to the outside.

FIG. 3A exemplarily illustrates the display device DD which is partially out-folded to be in an out-folded state at an angle, and FIG. 3B exemplarily illustrates the display device DD which is completely out-folded to be in a completely out-folded state.

Referring to FIG. 3A, in an embodiment, a folding axis FX may be defined to face the rear surface of the display device DD. A display surface corresponding to the folding region FA in the out-folded state may be folded while forming a convexly curved surface facing to the folding axis FX. Portions of display surfaces corresponding to the first and second non-folding regions NFA1 and NFA2 of the display device DD in the out-folded state may be exposed to the outside by facing in opposite directions.

Referring to FIG. 3B, in the completely out-folded state, portions of the display surface corresponding to the first and second non-folding regions NFA1 and NFA2 may overlap on a plane and may display images in opposite directions. In the completely out-folded state, the display region DA included in the front surface of the display device DD may be exposed to the outside and may display an image, and the image may be visually recognized from outside the display device DD (e.g., such as by a user) which is folded.

In the present embodiment, the display device DD is illustrated to be out-folded or in-folded around one of the folding axis FX, but the number of the folding axis FX defined in the display device DD is not limited thereto. The display device DD may be folded around a plurality of folding axes. The folding operation of the display device DD is not limited to the illustrated embodiment, and may be designed in various forms. Various components or layers of the display device DD may be foldable together with each other with respect to a folding axis FX at a folding region FA.

Figure 4:
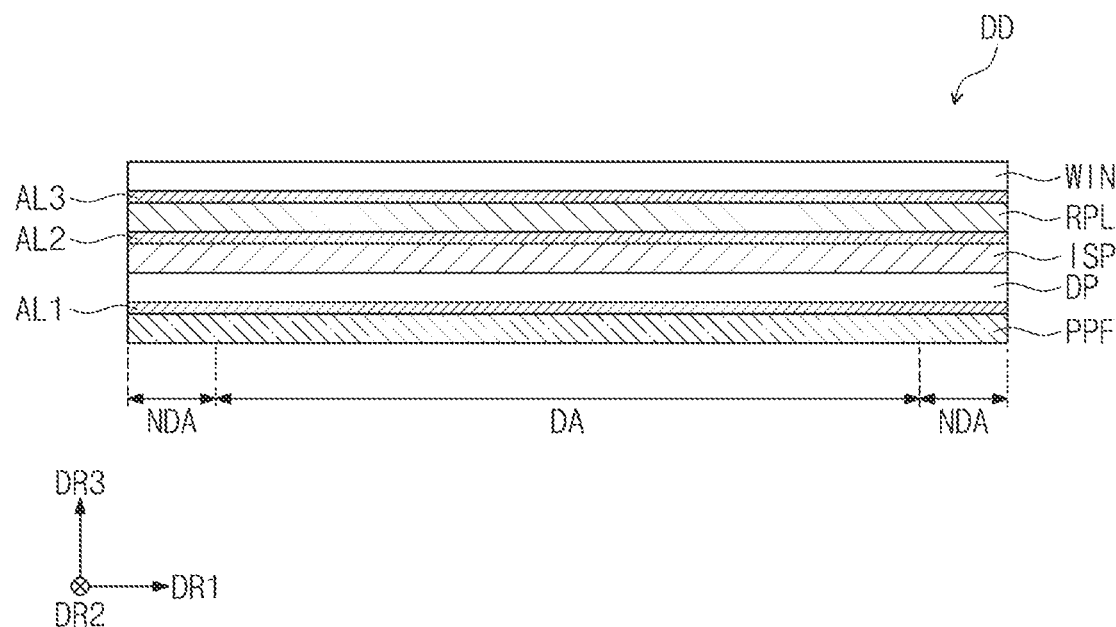
FIG. 4 is a cross-sectional view of a display device according to an embodiment.

FIG. 4 illustrates a cross-section of a display device DD according to an embodiment of the invention. FIG. 4 schematically illustrates a form in which components of the display device DD are stacked. Referring to FIG. 4, the display device DD may include a display panel DP, an input sensor ISP, a protective member PPF, an anti-reflection layer RPL, a window WIN, and first to third adhesive layers ALL AL2, and AL3.

The display panel DP according to an embodiment may be a light emission type display panel, but is not particularly limited thereto. In an embodiment, for example, the display panel DP may be an organic light emission display panel, an inorganic light emission display panel, or a quantum dot light emission display panel. A light emission layer of the organic light emission display panel may include an organic light emission material, and a light emission layer of the inorganic light emission display panel may include an inorganic light emission material. A light emission layer of the quantum dot light emission display panel may include a quantum dot, a quantum load, and the like. Hereinafter, the display panel DP will be described as an organic light emission display panel.

The input sensor ISP may be disposed on the display panel DP, to face the display panel DP. The input sensor ISP may be directly disposed on the display panel DP without a separate adhesive member. That is, after the display panel DP is formed, the input sensor ISP may be formed through a continuous process on a base surface provided by the display panel DP. However, the embodiment of the invention is not limited thereto. The input sensor ISP may be manufactured in a panel form through a separate process distinct from the process of the display panel DP, and then may be attached on the display panel DP by an adhesive member.

The input sensor ISP may sense an external input applied from the outside of the display device DD, and may obtain the coordinate information of the external input. The input sensor ISP may be driven by various methods, such as a capacitive method, a resistive method, an infrared method, or a pressure method. Here, the external input may have various forms such as pressure, temperature, light, and the like provided from the outside. The external input may include not only an input that comes into contact with the display device DD (e.g., a contact by an input tool such as a user's hand or pen), but also an input applied in close proximity to the display device DD to be sensed by the input sensor ISP.

The protective member PPF may be disposed on the rear surface of the display panel DP. The protective member PPF may include at least one of a protective film layer, an impact absorbing layer and a support plate, all protecting the display panel DP from an external impact.

The protective film layer may include a flexible polymer material such as polyethylene terephthalate or polyimide. The impact absorbing layer may include a material such as sponge, foam, or a urethane resin, and may absorb an impact applied to the display panel DP. The support plate may include a material having relatively high rigidity such as stainless steel, aluminum, or an alloy thereof, and may support a lower portion of the display panel DP. However, the protective member PPF is not limited to any one embodiment as long as it can protect the display panel DP.

The anti-reflection layer RPL may be disposed on the input sensor ISP. The anti-reflection layer RPL may reduce the reflectance of external light incident from outside the display device DD, such as from above of the display device DD.

In an embodiment, the anti-reflection layer RPL may include a phase retarder and/or a polarizer. The phase retarder may include a $\lambda/2$ phase retarder and/or a $\lambda/4$ phase retarder. The phase retarder may include a film type polarizer or a liquid crystal coating type polarizer. The film type polarizer may include a stretchable synthetic resin film, and the liquid crystal coating type polarizer may include liquid crystals arranged in an arrangement. However, the embodiment of the invention is not limited thereto. The phase retarder and the polarizer may be implemented in the form of one polarizing film.

In an embodiment, the anti-reflection layer RPL may include color filters. The color filters may be arranged in correspondence to the arrangement and light emission colors of pixels PX included in the display panel DP. The color filters may receive external light and filter the external light into the same color as the color emitted by the pixels PX. The anti-reflection layer RPL may further include a black matrix disposed adjacent to the color filters.

In an embodiment, the anti-reflection layer RPL may include a destructive interference structure. In an embodiment, for example, the destructive interference structure may include a first reflection layer and a second reflection layer disposed on different layers. First reflective light reflected from the first reflection layer and second reflective light reflected from the second reflection layer may be destructively interfered, and accordingly, the anti-reflection layer RPL may reduce the reflectance of external light.

The window WIN may be disposed on the anti-reflection layer RPL. The window WIN may protect the anti-reflection layer RPL, the input sensor ISP, and the display panel DP from external impacts and scratches. The window WIN may include an optically transparent insulation material. In an embodiment, for example, the window WIN may include glass, sapphire, or plastic. The window WIN may further include a functional layer such as a fingerprint prevention layer, a phase control layer, or a hard coating layer disposed on a transparent substrate.

The first adhesive layer AL1 is disposed between the display panel DP and the protective member PPF, and the display panel DP and the protective member PPF may be bonded to each other by the first adhesive layer AL1. The second adhesive layer AL2 is disposed between the anti-reflection layer RPL and the input sensor ISP, and the anti-reflection layer RPL and the input sensor ISP may be bonded to each other by the second adhesive layer AL2. The third adhesive layer AL3 is disposed between the window WIN and the anti-reflection layer RPL, and the window WIN and the anti-reflection layer RPL may be bonded to each other by the third adhesive layer AL3. In an embodiment, at least one of the first to third adhesive layers AL1, AL2, and AL3 may be omitted.

Each of the first to third adhesive layers AL1, AL2, and AL3 may include a transparent adhesive such as an optically clear adhesive (OCA) film, an optically clear resin (OCR), or a pressure sensitive adhesive (PSA) film. However, the type of an adhesive included in the first to third adhesive layers AL1, AL2, and AL3 is not limited thereto.

Figure 5:
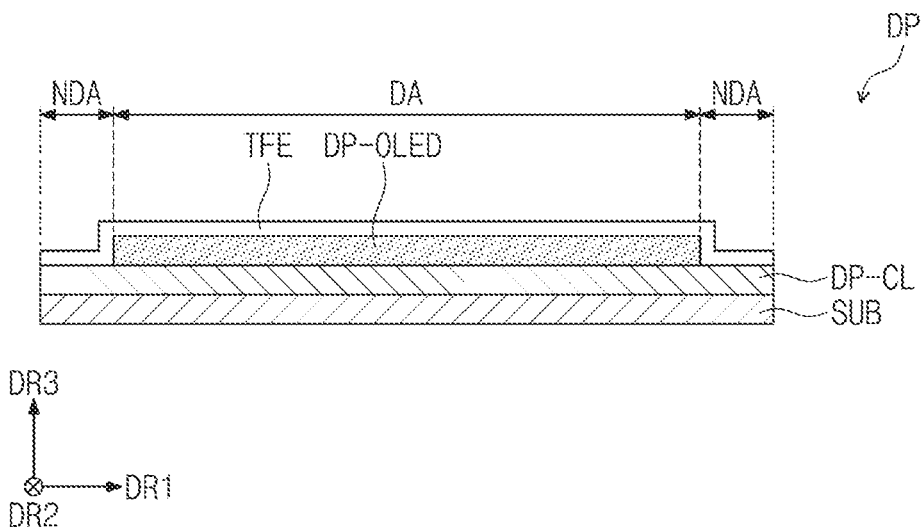
FIG. 5 is a cross-sectional view of a display panel according to an embodiment.

FIG. 5 is a cross-sectional view of a display panel DP according to an embodiment of the invention. Referring to FIG. 5, the display panel DP may include a base substrate SUB, a circuit element layer DP-CL, a display element layer DP-OLED, and a thin film encapsulation layer TFE.

The base substrate SUB may provide a base surface on which the circuit element layer DP-CL is disposed. The base substrate SUB may include the display region DA and the non-display region NDA which is adjacent to the display region DA.

The base substrate SUB may include a flexible polymer material. In an embodiment, for example, the base substrate SUB may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, a perylene-based resin and a polyimide-based resin. However, the material of the base substrate SUB is not limited thereto.

The circuit element layer DP-CL may be disposed on the base substrate SUB. The circuit element layer DP-CL may include at least one insulation layer, a driving circuit, signal lines, and signal pads to be described later. The display element layer DP-OLED may be disposed on the circuit element layer DP-CL. The display element layer DP-OLED may include light emission elements OLED overlapping the display region DA.

A pixel PX provided in plural including a plurality of pixels PX may be disposed in the circuit element layer DP-CL and in the display element layer DP-OLED. Each of the pixels PX may include transistors disposed in the circuit element layer DP-CL, and a light emission element OLED which is disposed in the display element layer DP-OLED and connected to the transistors. Each of the pixels PX may emit light through the display region DA in correspondence to a driving signal, and may define a display pixel provided in plural including a plurality of display pixels. The configuration of the pixels PX will be described in detail later.

The thin film encapsulation layer TFE may be disposed on the display element layer DP-OLED and encapsulate the light emission elements OLED. The thin film encapsulation layer TFE may include a plurality of thin films. The thin films of the thin film encapsulation layer TFE may be disposed to improve the optical efficiency of the light emission elements OLED or to protect the light emission elements OLED.

Figure 6:
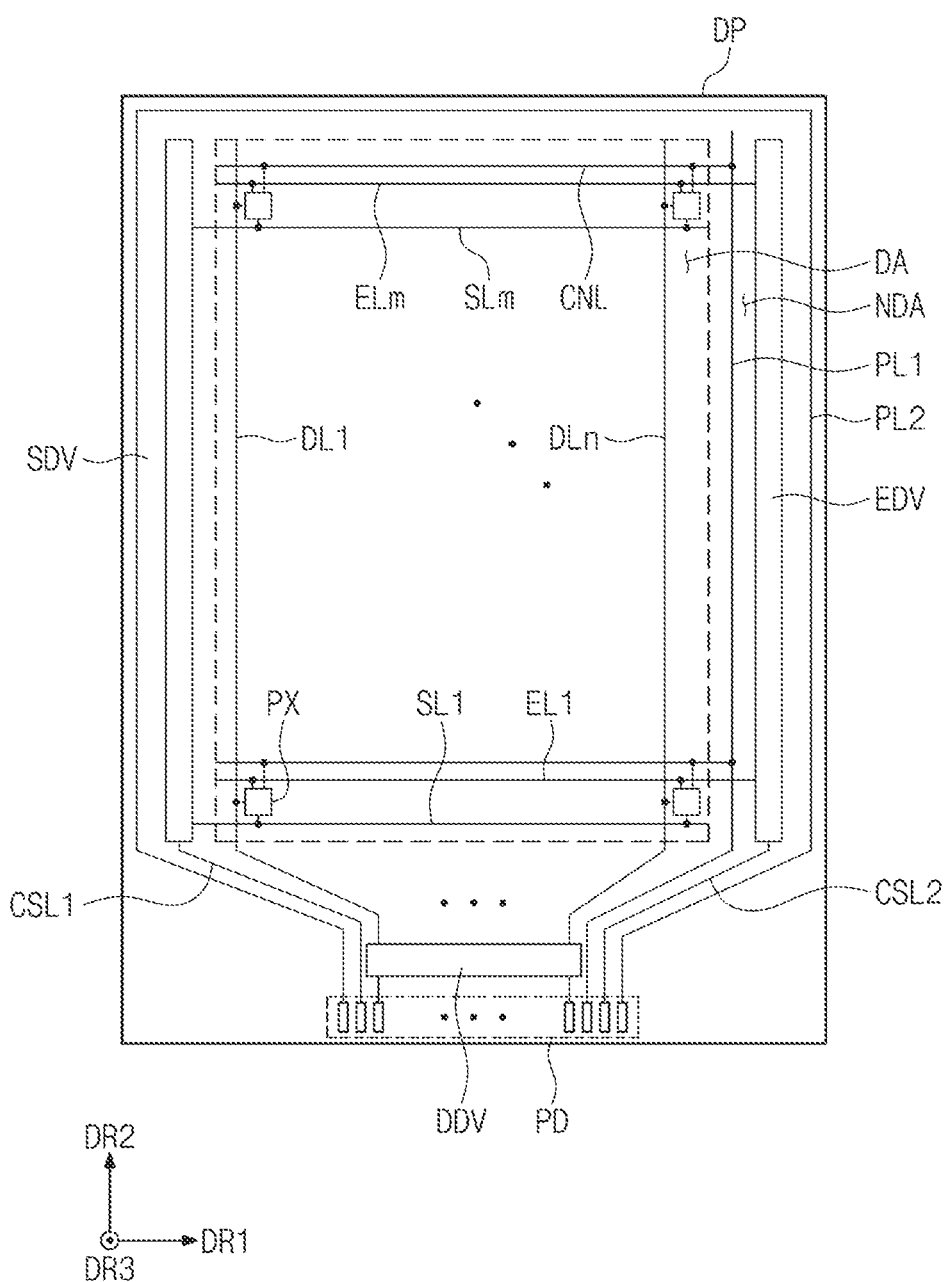
FIG. 6 is a plan view of a display panel according to an embodiment.

FIG. 6 is a plan view of a display panel DP according to an embodiment of the invention. Referring to FIG. 6, the display panel DP may include a plurality of pixels PX disposed in the display region DA, and a plurality of signal lines which are electrically connected to the pixels PX. One or more of the pixels PX may be disposed in the folding region FA and in the non-folding region of the display region DA. The display panel DP may include a scan driver SDV, a data driver DDV, a light emission driver EDV and a plurality of pads PD, all disposed in the non-display region NDA.

Each of the pixels PX may include a pixel drive circuit configured with a light emission element OLED to be described later, a plurality of transistors which are connected to the light emission element OLED (e.g., a switching transistor, a driving transistor, etc.), and a capacitor CAP. Each of the pixels PX may emit light in correspondence to an applied electrical signal.

The plurality of signal lines may include scan lines SL1 to SLm, data lines DL1 to DLn, light emission lines EL1 to ELm, first and second control lines CSL1 and CSL2, first and second power lines PL1 and PL2, and a connection line CNL provided in plural including connection lines CNL. Here, 'm' and 'n' represent natural numbers.

Each of the pixels PX may be connected to a corresponding scan line among the scan lines SL1 to SLm, and may be connected to a corresponding data line among the data lines DL1 to DLn. However, depending on the configuration of the pixel driving circuit of the pixels PX, more types of signal lines may be provided in the display panel DP.

The scan driver SDV and the light emission driver EDV may each be disposed in the non-display region NDA adjacent to long sides of the display panel DP. The data driver DDV may be disposed in the non-display region NDA adjacent to any one short side among short sides of the display panel DP. The data driver DDV may be adjacent to a lower end of the display panel DP on a plane.

The scan lines SL1 to SLm may be extended in the first direction DR1 and connected to the scan driver SDV. The data lines DL1 to DLn may be extended in the second direction DR2 and connected to the data driver DDV. The light emission lines EL1 to ELm may be extended in the first direction DR1 and connected to the light emission driver EDV.

The first power line PL1 may be extended in the second direction DR2 and disposed in the non-display region NDA. The first power line PL1 may be disposed between the display region DA and the light emission driver EDV. However, the embodiment of the invention is not limited thereto. The first power line PL1 may be disposed between the display region DA and the scan driver SDV.

The connection lines CNL may be extended in the first direction DR1 and arranged in the second direction DR2 to be connected to the first power line PL1 and to the pixels PX. A first voltage ELVDD may be applied to the pixels PX through the first power line PL1 and the connection lines CNL which are connected to each other. The connection lines CNL may be, substantially, defined as a portion of the first power line PL1 which receives the first voltage ELVDD.

The second power line PL2 may be extended along the first direction DR1 and the second direction DR2 to be disposed in the non-display region NDA. The second power line PL2 may be extended along the long sides of the display panel DP and the other short side of the display panel DP at which the data driver DDV is not disposed. The second power line PL2 may be disposed on the outer periphery than the scan driver SDV and the light emission driver EDV. However, the embodiment of the invention is not limited thereto.

The second power line PL2 may be extended toward the display region DA to be connected to the pixels PX. A second voltage ELVSS having a lower level than the first voltage ELVDD may be applied to the pixels PX through the second power line PL2.

The pads PD may be disposed in the non-display region NDA adjacent to the lower end of the display panel DP. The pads PD may be arranged along the first direction DR1. The display device DD may include a timing controller for controlling the operation of the scan driver SDV, the data driver DDV and the light emission driver EDV, and print circuit board including a voltage generation unit for generating the first and second voltages. The pads PD may be a portion of the display panel DP at which the printed circuit board of the display device DD is connected.

Each of the pads PD may be connected to a corresponding signal line among the plurality of signal lines SL1 to SLm. The first to second power lines PL1 and PL2 and the first to second control lines CSL1 and CSL2 may be connected to the pads PD. The data lines DL1 to DLn may be connected to corresponding pads PD through the data driver DDV. In an embodiment, for example, the data lines DL1 to DLn may be connected to the data driver DDV, and the data driver DDV may be connected to the pads PD respectively corresponding to the data lines DL1 to DLn.

The scan driver SDV may generate scan signals in response to a scan control signal. The scan signals may be applied to the pixels PX through the scan lines SL1 to SLm. The data driver DDV may generate data voltages corresponding the image signals in response to a data control signal. The data voltages may be applied to the pixels PX through the data lines DL1 to DLn. The light emission driver EDV may generate light emission signals in response to a light emission control signal. The light emission signals may be applied to the pixels PX through the light emission lines EL1 to ELm.

The pixels PX may be provided with the data voltages in response to the scan signals. The pixels PX may display an image by emitting light of luminance corresponding to the data voltages in response to the light emission signals. The light emission duration of the pixels PX may be controlled by the light emission signals. Accordingly, the display panel DP may output the image through the display region DA by operation or driving of the pixels PX.

Figure 7:
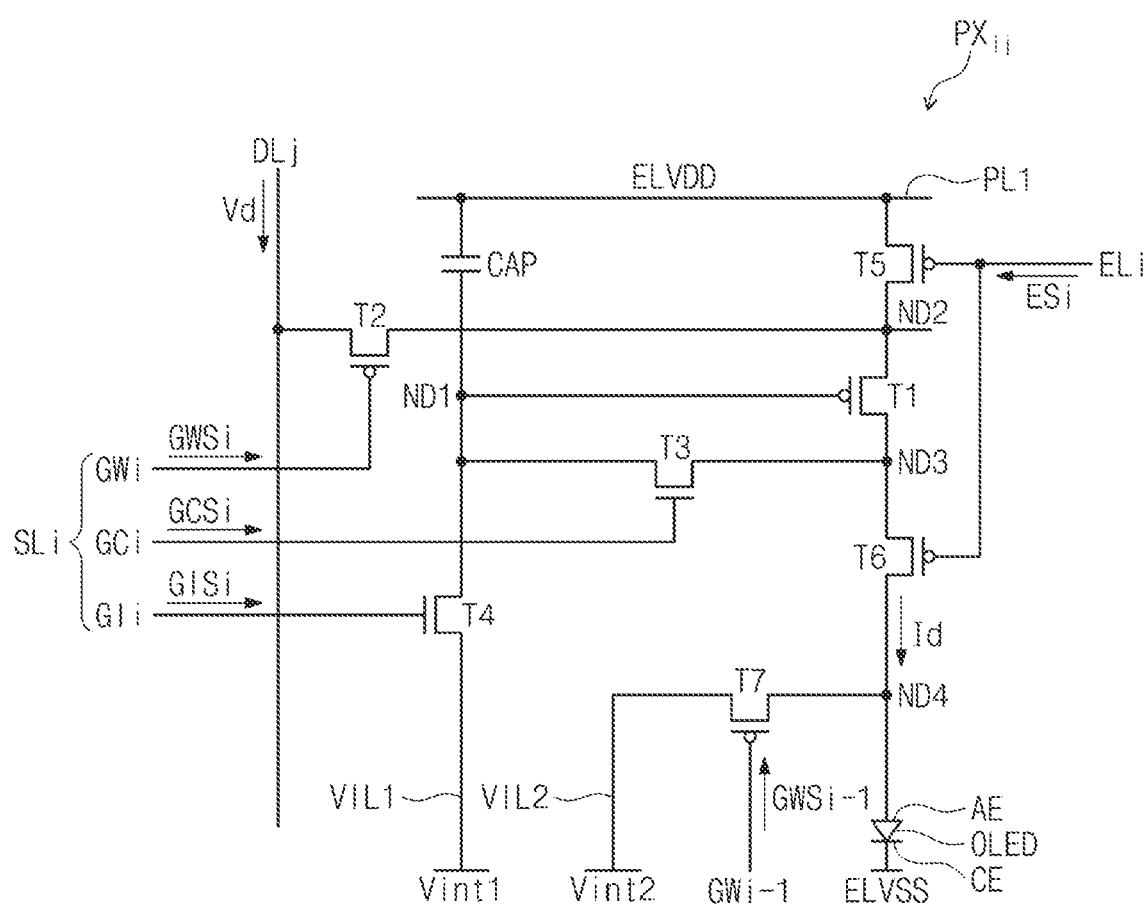
FIG. 7 is an equivalent circuit diagram of one pixel according to an embodiment.

FIG. 7 is a view illustrating an equivalent circuit of one pixel PX according to an embodiment of the invention. FIG. 7 exemplarily illustrates a pixel PXij connected to an i-th scan line SLi, an i-th light emission line ELi, and a j-th data line DLj. Here, 'i' and 'j' represent natural numbers.

Referring to FIG. 7, the pixel PXij may include a light emission element OLED, and a plurality of transistors T1 to T7, and a capacitor CAP. The plurality of transistors T1 to T7 and the capacitor CAP may control the amount of current (e.g., electrical current) flowing in the light emission element OLED. The light emission element OLED may generate light having a luminance in accordance to the amount of current provided.

The i-th scan line SLi may include first to third scan lines GWi, GCi, and GIi. The first scan line GWi which receives an i-th write scan signal GWSi may be defined as an i-th write scan line GWi. The second scan line GCi which receives an i-th compensation scan signal GCSi may be defined as an i-th compensation scan line GCi. The third scan line GIi which receives an i-th initialization scan signal GISi may be defined as an i-th initialization scan line GIi.

The transistors T1 to T7 may include first to seventh transistors T1 to T7. The first to seventh transistors T1 to T7 may each include a source (terminal) electrode, a drain (terminal) electrode, and a gate (terminal) electrode. Hereinafter, the source (terminal) electrode may be referred to as a source, the drain (terminal) electrode as a drain, and the gate (terminal) electrode as a gate.

In an embodiment, the first, second, fifth, sixth, and seventh transistors T1, T2, T5, T6, and T7 may include P-type transistors. The third and fourth transistors T3 and T4 may include N-type transistors. However, the embodiment of the invention is not limited thereto. The first to seventh transistors T1 to T7 may be implemented as any one of a P-type transistor or an N-type transistor. Also, in an embodiment of the invention, at least one of the first to seventh transistors T1 to T7 may be omitted.

The first transistor T1 may be defined as a driving transistor, and the second transistor T2 may be defined as a switching transistor. The third transistor T3 may be defined a compensation transistor. The fourth transistor T4 and the seventh transistor T7 may be defined as initialization transistors. The fifth transistor T5 and the sixth transistor T6 may be defined as light emission control transistors.

The light emission element OLED may be defined as an organic light emission element. The light emission element OLED may include an anode AE and a cathode CE. The anode AE may receive a first voltage ELVDD through the sixth, first, and fifth transistors T6, T1, and T5. The cathode CE may receive a second voltage ELVSS.

In the present disclosure, "being electrically connected between a transistor and a signal line or between a transistor and a transistor" means that "a source, a drain, and a gate of a transistor have an integral shape with a signal line or are connected through a connection electrode or another transistor."

A plurality of nodes ND1, ND2, ND3, and ND4 may be defined in the equivalent circuit of the pixel PXij. The nodes ND1, ND2, ND3, and ND4 may mean a point at which elements constituting the equivalent circuit of the pixel PXij are connected and meet.

The first transistor T1 is connected between the anode AE of the light emission element OLED and the first power line PL1 which receives the first voltage ELVDD, and may be switched by a voltage of the first node ND1. The source of the first transistor T1 may be electrically connected to the first power line PL1, and the drain of the first transistor T1 may be electrically connected to the anode AE of the light emission element OLED.

Specifically, the first transistor T1 may be connected between the fifth transistor T5 and the sixth transistor T6. The source of the first transistor T1 may be connected to the fifth transistor T5 and receive the first voltage ELVDD through the fifth transistor T5. The drain of the first transistor T1 may be connected to the sixth transistor T6 and be connected to the anode AE through the sixth transistor T6. The gate of the first transistor T1 may be electrically connected to the first node ND1. The first transistor T1 may control the amount of current flowing in the light emission element OLED in accordance with the voltage of the first node ND1 which is applied to the gate of the first transistor T1.

However, between the first transistor T1 and the first power line PL1, and between the first transistor T1 and the anode AE of the light emission element OLED, another transistor may be disposed or omitted.

The second transistor T2 is connected between the first transistor T1 connected to the first power line PL1, and the data line DLj, and may be switched by the i-th write scan signal GWSi. Specifically, the source of the second transistor T2 may be electrically connected to the j-th data line DLj, and the second transistor T2 and the first transistor T1 may be connected through the second node ND2. The second node ND2 may connect the first power line PL1 and the source of the first transistor T1 to each other. That is, the drain of the second transistor T2 may be electrically connected the source of the first transistor T1. The gate of the second transistor T2 may be electrically connected to the i-th write scan line GWi.

The second transistor T2 may be turned on by the i-th write scan signal GWSi applied through the i-th write scan line GWi and electrically connect the data line DLj and the source of the first transistor T1. The second transistor T2 may perform a switching operation of providing a data voltage Vd applied through the data line DLj to the source of the first transistor T1.

The third transistor T3 is connected between the first node ND1 and the anode AE of the light emission element OLED, and may be switched by the i-th compensation scan signal GCSi. Specifically, the third transistor T3 and the first transistor T1 may be connected through the third node ND3. The third node ND3 may be connected to the drain of the first transistor T1 and to the anode AE. The drain of the third transistor T3 may be electrically connected the anode AE and to the drain of the first transistor T1. The gate of the third transistor T3 may be electrically connected to the i-th compensation scan line GCi.

The third transistor T3 may be turned on by the i-th compensation scan signal GCSi applied through the i-th compensation scan line GCi and electrically connect the drain of the first transistor T1 and the gate of the first transistor T1. When the third transistor T3 is turned on, the first transistor T1 and the third transistor T3 may be connected in a diode form.

The fourth transistor T4 is connected between the first node ND1 and a first initialization line VIL1, and may be switched by the i-th initialization scan signal GISi. The drain of the fourth transistor T4 may be electrically connected to the first node ND1, and the source of the fourth transistor T4 may be electrically connected to the first initialization line VIL1. The gate of the fourth transistor T4 may be electrically connected to the i-th initialization scan line GIi.

The fourth transistor T4 may be turned on by the i-th initialization scan signal GISi applied through the i-th initialization scan line GIi and provide a first initialization voltage Vint1 applied through the first initialization line VIL1 to the first node ND1.

The fifth transistor T5 may be connected between the first power line PL1 and the second node ND2. The source of the fifth transistor T5 may be electrically connected to the first power line PL1 to receive the first voltage ELVDD, and the drain of the fifth transistor T5 may be electrically connected to the source of the first transistor T1. The gate of the fifth transistor T5 may be electrically connected to the i-th light emission line ELi.

The sixth transistor T6 may be connected between the third node ND3 and the anode AE. The source of the sixth transistor T6 may be electrically connected to the drain of the first transistor T1, and the drain of the sixth transistor T6 may be electrically connected to the anode AE of the light emission element OLED. The gate of the sixth transistor T6 may be electrically connected to the i-th light emission line ELi.

The fifth transistor T5 and the sixth transistor T6 may be turned on by an i-th light emission signal ESi applied through the i-th light emission line ELi. By the fifth transistor T5 and the sixth transistor T6 which are turned on, the first voltage ELVDD may be provided to the light emission element OLED to allow a driving current Id to flow in the light emission element OLED. Accordingly, the light emission element OLED may emit light.

The seventh transistor T7 may be connected between the sixth transistor T6 and a second initialization line VIL2. The seventh transistor T7 and the sixth transistor T6 may be connected through the fourth node ND4. The fourth node ND4 may be connected to the drain of the sixth transistor T6 and to the anode AE. The source of the seventh transistor T7 may be electrically connected to the drain of the sixth transistor T6, and the drain of the seventh transistor T7 may be electrically connected to the second initialization line VIL2. The gate of the seventh transistor T7 may be electrically connected to an i−1-th write scan line GWi−1. The i−1-th write scan line GWi−1 may be defined as a write scan line in the previous stage of the i-th write scan line GWi.

The seventh transistor T7 may be turned on by an i−1-th write scan signal GWSi−1 applied through the i−1-th write scan line GWi−1 and provide a second initialization voltage Vint2 received through the second initialization line VIL2 to the anode AE of the light emission element OLED.

In an embodiment of the invention, the seventh transistor T7 may be omitted. In an embodiment of the invention, the second initialization voltage Vint2 may have the same level as the first initialization voltage Vint1, but is not limited thereto, and may have a different level from the first initialization voltage Vint1.

The seventh transistor T7 may improve the capability of the pixel PX to express black. When the seventh transistor T7 is turned on, a parasitic capacitor of the light emission element OLED may be discharged. Accordingly, when black luminance is implemented, the light emission element OLED does not emit light due to a leakage current from the first transistor T1, and accordingly, the black expression capability may be improved.

The capacitor CAP may include a first capacitor electrode which receives the first voltage ELVDD and a second capacitor electrode which is connected to the first node ND1. When the fifth transistor T5 and the sixth transistor T6 are turned on, the amount of current flowing in the first transistor T1 may be determined in accordance with a voltage stored in the capacitor CAP.

Figure 8:
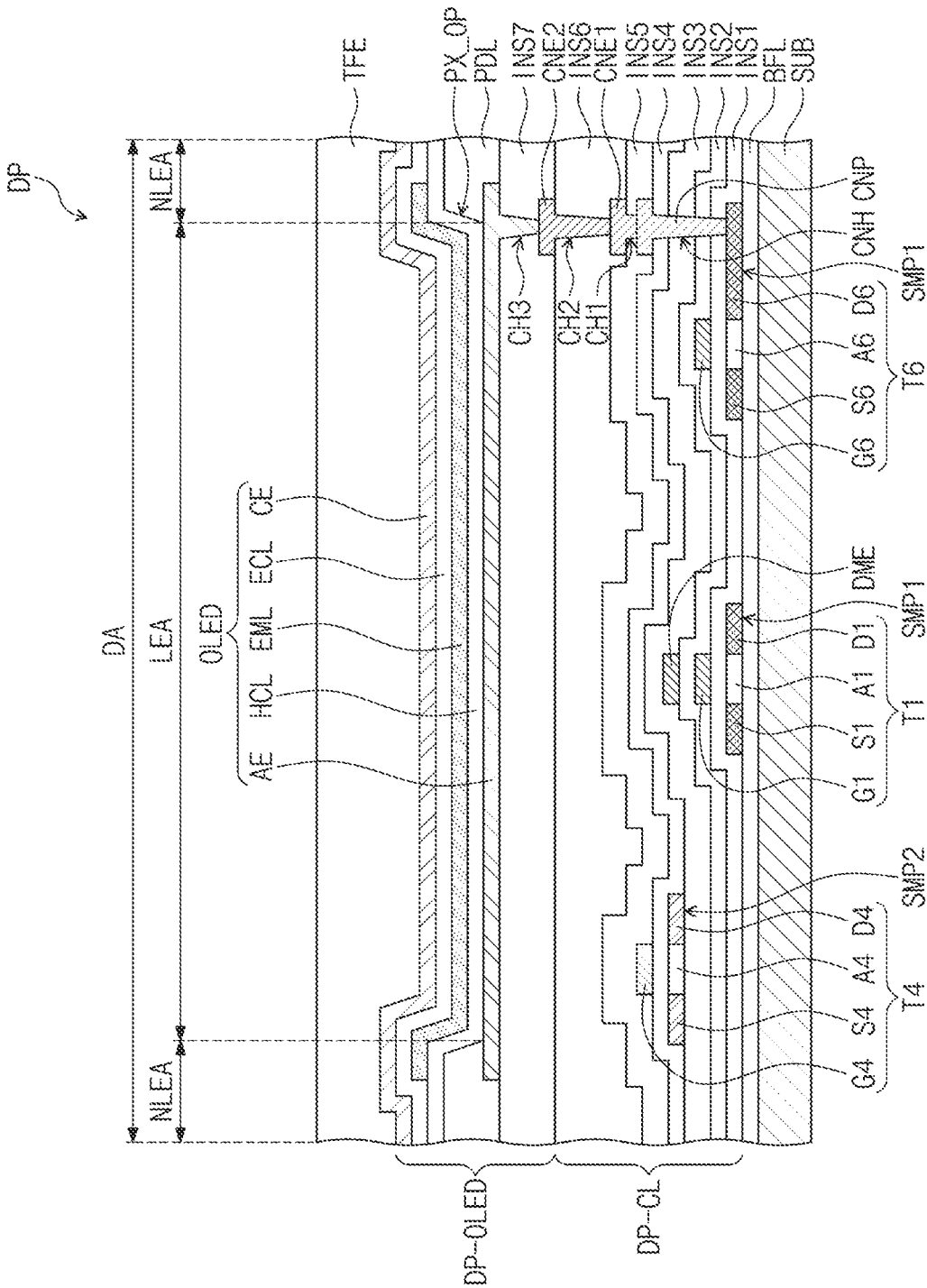
FIG. 8 is a cross-sectional view of a display panel according to an embodiment.

FIG. 8 is a cross-sectional view of a display panel DP according to an embodiment of the invention. FIG. 8 is a view exemplarily illustrating cross-sections of the first transistor T1, the fourth transistors T4, and the sixth transistor T6.

Referring to FIG. 8, each of the first, fourth, and sixth transistors T1, T4, and T6 may include a source electrode S1, S4, and S6 (respectively, first, fourth, and sixth source electrodes S1, S4, and S6), an active region A1, A4, and A6 (respectively, first, fourth, and sixth active regions A1, A4, and A6), a drain electrode D1, D4, and D6 (respectively, first, fourth, and sixth drain electrodes D1, D4, and D6), and a gate electrode G1, G4, and G6 (respectively, first, fourth, and sixth gate electrodes G1, G4, and G6).

The base substrate SUB may provide a base surface on which the circuit element layer DP-CL is disposed. At least one inorganic layer may be disposed on an upper surface of the base substrate SUB. The inorganic layer may constitute a barrier layer and/or a buffer layer BFL. FIG. 8 exemplarily illustrates a buffer layer BFL disposed on the base substrate SUB. The buffer layer BFL may improve the coupling force between the base substrate SUB and a semiconductor pattern layer SMP1 of the circuit element layer DP-CL. The buffer layer BFL may include at least one of aluminum oxide, titanium oxide, silicon oxide, silicon nitride, silicon oxynitride, zirconium oxide and hafnium oxide.

The circuit element layer DP-CL may include semiconductor pattern layers SMP1 and SMP2, a conductive pattern layer, a signal line, and insulation layers. In a process of manufacturing (or providing) the display panel DP, an insulation layer, a semiconductor layer and a conductive layer may be formed by a coating or deposition process, and thereafter, the insulation layer, the semiconductor layer and the conductive layer may be selectively patterned by a photolithography process. Through the above processes, the semiconductor pattern layers SMP1 and SMP2, the conductive pattern layer, the signal line, and the like which constitute the circuit element layer DP-CL may be formed (or provided).

The first semiconductor pattern layer SMP1 may be disposed on the base substrate SUB. In an embodiment, the first semiconductor pattern layer SMP1 may be disposed on the buffer layer BFL. The first semiconductor pattern layer SMP1 may have different electrical properties depending on whether or not the first semiconductor pattern layer SMP1 is doped. The first semiconductor pattern layer SMP1 may include a first region having a high conductivity rate, and a second region having a low conductivity rate. The first region may be doped with an N-type dopant or a P-type dopant. A P-type transistor may include a doped region doped with the P-type dopant, and an N-type transistor may include a doped region doped with the N-type dopant. The second region may be a non-doped region or a region doped to a lower concentration than the first region.

The conductivity of the first region may be greater than the conductivity of the second region, and the first region may substantially serve as a source electrode and a drain electrode of a transistor. The second region may substantially correspond to an active (or a channel) of a transistor.

The first semiconductor pattern layer SMP1 may include polysilicon. However, the embodiment of the invention is not limited thereto, and the first semiconductor pattern layer SMP1 may include amorphous silicon or a metal oxide.

The first semiconductor pattern layer SMP1 may include the first source electrode S1 (or the first source S1), the first active region A1, and the first drain electrode D1 (or the first drain D1) of the first transistor T1, and the sixth source electrode S6 (or the sixth source S6), the sixth active region A6, and the sixth drain electrode D6 (or the sixth drain D6) of the sixth transistor T6. Although not illustrated in FIG. 8, the sixth source electrode S6 of the sixth transistor T6 may be connected to the first drain electrode D1 of the first transistor T1 and formed as one body.

In the present disclosure, a source, an active, and a drain included in one transistor may be defined as a semiconductor pattern. In an embodiment, for example, the first source electrode S1, the first active region A1, and the first drain electrode D1 included in the first transistor T1 may be defined as a first semiconductor pattern, and the sixth source electrode S6, the sixth active region A6, and the sixth drain D6 included in the sixth transistor T6 may be defined as a sixth semiconductor pattern. The first semiconductor pattern layer SMP1 illustrated in FIG. 8 may include the first semiconductor pattern and the sixth semiconductor pattern.

The circuit element layer DP-CL includes a plurality of insulation layers disposed on the base substrate SUB, and FIG. 8 illustrates first to seventh insulation layers INS1 to INS7 as an example of the plurality of insulation layers. However, the number of insulation layers is not limited thereto, and may vary depending on a lamination process or the configuration of the circuit element layer DP-CL.

The first semiconductor pattern of the first transistor T1 and the sixth semiconductor pattern of the sixth transistor T6 may be disposed on the same layer, which is the buffer layer BFL. As being on the same layer, patterns may be provided in a same process and/or include a same material, patterns may be in the same layer as each other as respective portions of a same material layer, may form an interface with a same underlying or overlying layer, etc., without being limited thereto. The first insulation layer INS1 may be disposed on the first semiconductor pattern layer SMP1. On the first insulation layer INS1, the first gate electrode G1 and the sixth gate electrode G6 may be disposed. The first gate electrode G1 may overlap the first active region A1, and the sixth gate G6 may overlap the sixth active region A6. A gate electrode may serve as a mask during the process of doping a semiconductor pattern.

Although not illustrated in FIG. 8, in an embodiment, the configuration of a source electrode, an active, a drain electrode, and a gate electrode of each of the second, fifth, and seventh transistors T2, T5, and T7 may be the same as those of the first and sixth transistors T1 and T6.

The second insulation layer INS2 may be disposed on the first insulation layer INS1 to cover the gate electrodes G1 and G6. An upper electrode DME may be disposed on the second insulation layer INS2. The upper electrode DME may be disposed above the first and sixth transistors T1 and T6. The upper electrode DME and the first gate electrode G1 may together form the capacitor CAP (see FIG. 7) described above.

The third insulation layer INS3 may be disposed on the second insulation layer INS2 to cover the upper electrode DME. The second semiconductor pattern layer SMP2 may be disposed on the third insulation layer INS3. The second semiconductor pattern layer SMP2 may include an oxide semiconductor including a metal oxide. The oxide semiconductor may include a crystalline or amorphous oxide semiconductor.

The second semiconductor pattern layer SMP2 may include a plurality of regions divided according to whether the metal oxide has been reduced or not. A region in which the metal oxide has been reduced (hereinafter, a reduction region) may have greater conductivity than a region in which the metal oxide has not been reduced (hereinafter, a non-reduction region). The reduction region may substantially serve as a source electrode and a drain electrode of a transistor. The non-reduction region may substantially correspond to an active (or a channel) of a transistor.

The second semiconductor pattern layer SMP2 may include a fourth semiconductor pattern of the fourth transistor T4. The second semiconductor pattern layer SMP2 may include the fourth source electrode S4, the fourth active region A4, and the fourth drain electrode D4. In an embodiment, the fourth semiconductor pattern may be disposed on (or in) a different layer from a layer on (or in) which the first and sixth semiconductor patterns are disposed. The fourth semiconductor pattern may be disposed above the first and sixth semiconductor patterns.

The fourth insulation layer INS4 may be disposed on the second semiconductor pattern layer SMP2. On the fourth insulation layer INS4, the fourth gate electrode G4 may be disposed. The fourth gate electrode G4 may overlap the fourth active region A4. Although not illustrated in FIG. 8, in an embodiment, the configuration of a source electrode, an active, a drain electrode, and a gate electrode of the third transistor T3 may be the same as those of the fourth transistor T4.

The circuit element layer DP-CL of the invention may include a connection pattern CNP which connects one or more transistors (e.g., a pair of two transistors) to each other. In an embodiment, the connection pattern CNP may be disposed on the fourth insulation layer INS4. That is, the connection pattern CNP may be disposed on the same layer as a layer on which the fourth gate electrode G4 is disposed, and may be formed through the same process. The connection pattern CNP may be connected to the sixth drain electrode D6 through a connection contact hole CNH passing through the first to fourth insulation layers INS1 to INS4. However, the embodiment of the invention is not limited thereto. The connection pattern CNP may be formed through the same process as connection electrodes to be described layer, and may be disposed on the same layer as a layer on which the connection electrodes are disposed. A detailed description of the connection pattern CNP will be given later with reference to the drawings.

In an embodiment, the first to fifth insulation layers INS1 to INS5 may each include inorganic layers, and one or more of these respective insulation layer may together define a lower insulation layer. In an embodiment, for example, an inorganic layer may include at least one of aluminum oxide, titanium oxide, silicon oxide, silicon nitride, silicon oxynitride, zirconium oxide and hafnium oxide. However, the material of the inorganic layer is not limited to the above examples.

At least one connection electrode CNE1 and CNE2 may be disposed between the sixth transistor T6 and the light emission element OLED. FIG. 8 illustrates a plurality of connection electrodes including first and second connection electrodes CNE1 and CNE2 disposed between the sixth transistor T6 and the light emission element OLED. The first and second connection electrodes CNE1 and CNE2 may be disposed on the connection pattern CNP. The connection pattern CNP, and the first and second connection electrodes CNE1 and CNE2 may electrically connect the sixth transistor T6 and the light emission element OLED to each other.

The first connection electrode CNE1 may be disposed on the fifth insulation layer INS5. The first connection electrode CNE1 may be disposed on the connection pattern CNP and be connected to the connection pattern CNP through a first contact hole CH1 passing through the fifth insulation layer INS5. The first connection electrode CNE1 may be electrically connected to the sixth drain electrode D6 of the sixth transistor T6 through the connection pattern CNP.

However, the embodiment of the invention is not limited thereto. The first connection electrode CNE1 may be directly connected to the sixth drain electrode D6. That is, the first connection electrode CNE1 may be disposed on the sixth drain electrode D6 not overlapping the connection pattern CNP and be connected to the sixth drain electrode D6 through a contact hole. In an embodiment, the connection pattern CNP may be formed on the fifth insulation layer INS5, in which case, the first connection electrode CNE1 may be omitted.

The sixth insulation layer INS6 may be disposed on the fifth insulation layer INS5 to cover the first connection electrode CNE1. The second connection electrode CNE2 may be disposed on the sixth insulation layer INS6. The second connection electrode CNE2 may be connected to the first connection electrode CNE1 through a second contact hole CH2 passing through the sixth insulation layer INS6.

The seventh insulation layer INS7 may be disposed on the sixth insulation layer INS6 to cover the second connection electrode CNE2. The sixth and seventh insulation layers INS6 and INS7 may include an inorganic layer or an organic layer.

The display element layer DP-OLED may be disposed on the circuit element layer DP-CL. The display element layer DP-OLED may include the light emission element OLED and a pixel definition film PDL. The light emission element OLED may include a first electrode AE, a second electrode CE, a hole control layer HCL, an electron control layer ECL, and a light emission layer EML. The first electrode AE may be the anode AE illustrated in FIG. 7, and the second electrode CE may be the cathode CE illustrated in FIG. 7.

The display region DA may include a light emission region LEA and a non-light emission region NLEA adjacent to the light emission region LEA, which correspond to each of the pixels PXij (see FIG. 7). The light emission region LEA may correspond to a region in which the light emission element OLED is disposed.

The first electrode AE of the light emission element OLED may be disposed on the seventh insulation layer INS7. The first electrode AE of the light emission element OLED may be electrically connected to the second connection electrode CNE2 through a third contact hole CH3 passing through the seventh insulation layer INS7. On the first electrode AE of the light emission element OLED and the seventh insulation layer INS7, the pixel definition film PDL which exposes a portion of the first electrode AE of the light emission element OLED to outside the pixel definition film PDL, may be disposed. In the pixel definition film PDL, a light emission opening PX_OP for exposing the portion of the first electrode AE of the light emission element OLED to outside the pixel definition film PDL, may be defined. In the present embodiment, the portion of the first electrode AE of the light emission element OLED exposed by the light emission opening PX_OP may correspond to the light emission region LEA.

The pixel definition film PDL may include an organic material. The pixel definition film PDL of an embodiment may have a color. In an embodiment, for example, the pixel definition film PDL may include a base resin and a black pigment and/or a black dye which is combined with the base resin. However, the embodiment of the pixel definition film PDL is not limited thereto.

The hole control layer HCL may be disposed on the first electrode AE of the light emission element OLED and the pixel definition film PDL. The hole control layer HCL may be commonly disposed in the light emission region LEA and the non-light emission region NLEA. The hole control layer HCL may include at least one of a hole transport layer and a hole injection layer.

The light emission layer EML may be disposed on the hole control layer HCL. The light emission layer EML may be disposed in a region corresponding to the light emission opening PX_OP. The light emission layer EML may include an organic material and/or an inorganic material. The light emission layer EML may generate light of any one of red, green, and blue colors.

The electron control layer ECL may be disposed on the light emission layer EML and the hole control layer HCL. The electron control layer ECL may be commonly disposed in the light emission region LEA and the non-light emission region NLEA. The electron control layer ECL may include at least one of an electron transport layer and an electron injection layer.

The second electrode CE of the light emission element OLED may be disposed on the electron control layer ECL. The second electrode CE of the light emission element OLED may be commonly disposed in the pixels PX and provided with a common voltage.

The thin film encapsulation layer TFE may be disposed on the light emission element OLED. The thin film encapsulation layer TFE may include a thin film inorganic layer, a thin film organic layer, and a thin film inorganic layer sequentially stacked.

The thin film inorganic layer may protect a pixel PX from moisture and/or oxygen. The thin film inorganic layer may include at least one of aluminum oxide, titanium oxide, silicon oxide, silicon nitride, silicon oxynitride, zirconium oxide and hafnium oxide. However, the material of the thin film inorganic layer is not limited to the above examples.

The thin film organic layer may protect a pixel PX from foreign materials such as dust particles. The thin film organic layer may include an acrylic resin. However, the material of the thin film organic layer is not limited thereto.

The first voltage ELVDD (see FIG. 7) may be applied to the first electrode AE of the light emission element OLED, and the second voltage ELVSS (see FIG. 7) may be applied to the second electrode CE of the light emission element OLED. A hole and an electron injected into the light emission layer EML are combined to form an exciton, and when the exciton transits to a ground state, the light emission element OLED may emit light. When the light emission element OLED emits light, the display panel DP may display an image through the display region DA.

FIG. 9A to FIG. 9G are plane views illustrating the planar structure of the pixel PXij illustrated in FIG. 7. FIG. 9A to FIG. 9G illustrate a sequential stacking structure of patterns constituting the pixel PXij. The patterns of the pixel PXij may form the source electrodes S1 to S7, the drain electrodes D1 to D7, the active regions A1 to A7, the gate electrodes G1 to G7, the capacitor CAP, connection patterns CNP1 and CNP2, and connection electrodes.

Figure 9A:
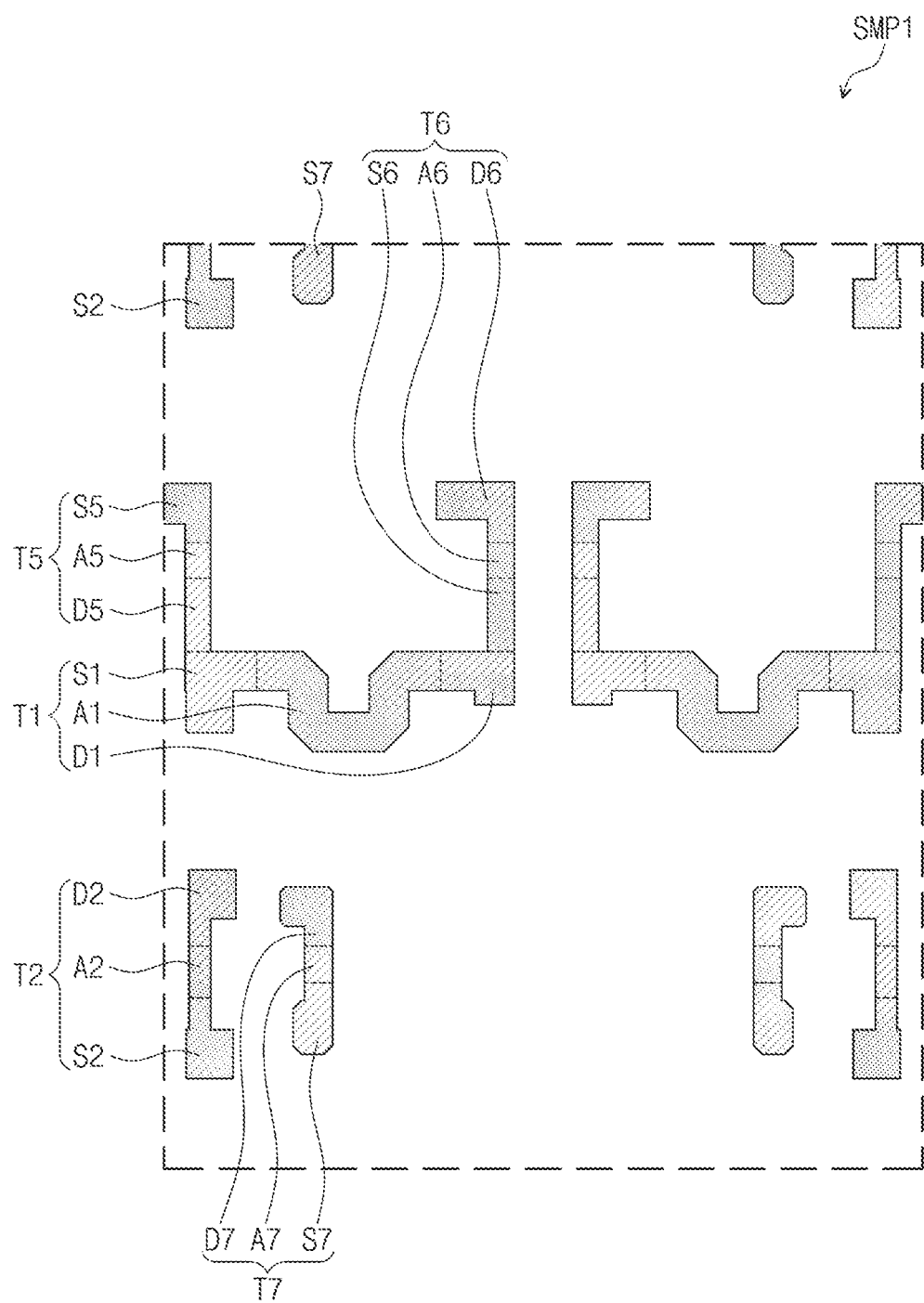
FIG. 9A to FIG. 9G are plan views according to the stacking order of patterns of a pixel according to an embodiment.

Referring to FIG. 9A, on the base substrate SUB (see FIG. 8), the first semiconductor pattern layer SMP1 may be disposed. The first semiconductor pattern layer SMP1 may include a plurality of regions having different doping concentrations. From the first semiconductor pattern layer SMP1, the first, second, fifth, sixth, and seventh source electrodes S1, S2, S5, S6, and S7, the first, second, fifth, sixth, and seventh drain electrodes D1, D2, D5, D6, and D7, and the first, second, fifth, sixth, and seventh active regions A1, A2, A5, A6, and A7 of the first, second, fifth, sixth, and seventh transistors T1, T2, T5, T6, and T7 may be formed.

The first, second, fifth, sixth, and seventh active regions A1, A2, A5, A6, and A7 may be respectively disposed between the first, second, fifth, sixth, and seventh source electrodes S1, S2, S5, S6, and S7, and the first, second, fifth, sixth, and seventh drain electrodes D1, D2, D5, D6, and D7.

In the present disclosure, a source electrode and a drain electrode included in one transistor may be defined as a semiconductor pattern. The source electrodes, active regions, and drains electrodes included in the first to seventh transistors T1 to T7 may be respectively defined as first to seventh semiconductor patterns. In an embodiment, for example, the first source electrodes S1, the first active region A1, and the first drain electrode D1 formed from the first semiconductor pattern layer SMP1 and included in the first transistor T1 may be defined as a first semiconductor pattern.

The first semiconductor pattern of the first transistor T1 may be formed as one body with the fifth semiconductor pattern of the fifth transistor T5 and the sixth semiconductor pattern of the sixth transistor T6, on the same layer among layers on the base substrate SUB. Specifically, the fifth drain electrode D5 of the fifth transistor T5 may be extended and formed from the first source electrode S1 of the first transistor T1. The sixth source electrode S6 of the sixth transistor T6 may be extended and formed from the first drain electrode D1 of the first transistor T1.

Some of semiconductor patterns of transistors formed on the same layer may be spaced apart on a plane (e.g., in a direction along the base substrate SUB). The second semiconductor pattern of the second transistor T2 may be spaced apart from the first semiconductor pattern of the first transistor T1 on a plane. The seventh semiconductor pattern of the seventh transistor T7 may be spaced apart from the sixth semiconductor pattern of the sixth transistor T6 on a plane.

The first source electrode S1 of the first transistor T1 and the second drain electrode D2 of the second transistor T2 which are electrically connected to each other as described above may be spaced apart from each other in the first semiconductor pattern layer SMP1. In addition, the sixth drain electrode D6 of the sixth transistor T6 and the seventh drain electrode D7 of the seventh transistor T7 which are electrically connected to each other may be spaced apart from each other in the first semiconductor pattern layer SMP1. The above may be connected by the connection patterns CNP1 and CNP2 (see FIG. 9E) to be described later.

The first transistor T1 and the second transistor T2 according to an embodiment of the invention may be connected by the connection pattern CNP1 (see FIG. 9E) which is provided separately from a semiconductor pattern (e.g., in a different layer from the semiconductor pattern). In addition, the sixth transistor T6 and the seventh transistor T7 may be connected by the connection pattern CNP2 (see FIG. 9E) which is provided separately from a semiconductor pattern. When the extension length of a semiconductor pattern is increased, the semiconductor pattern may be relatively vulnerable to an external impact or stress caused by folding, so that cracks may be generated in the semiconductor pattern. The extended semiconductor pattern may be in a folding region FA and/or in a non-folding region to be influenced by folding of the display device DD (or the display panel DP) at the folding region FA, where the external impact or the stress is undesirably applied to the extended semiconductor pattern. However, in one or more embodiment of the invention, the connection patterns in the folding region FA and/or in a non-folding region influenced by the folding operation, may electrically connect transistors to each other without including a semiconductor pattern extended therebetween, and at the same time, may prevent damage to a respective semiconductor pattern of the electrically-connected transistors. This will be described in detail later.

Figure 9B:
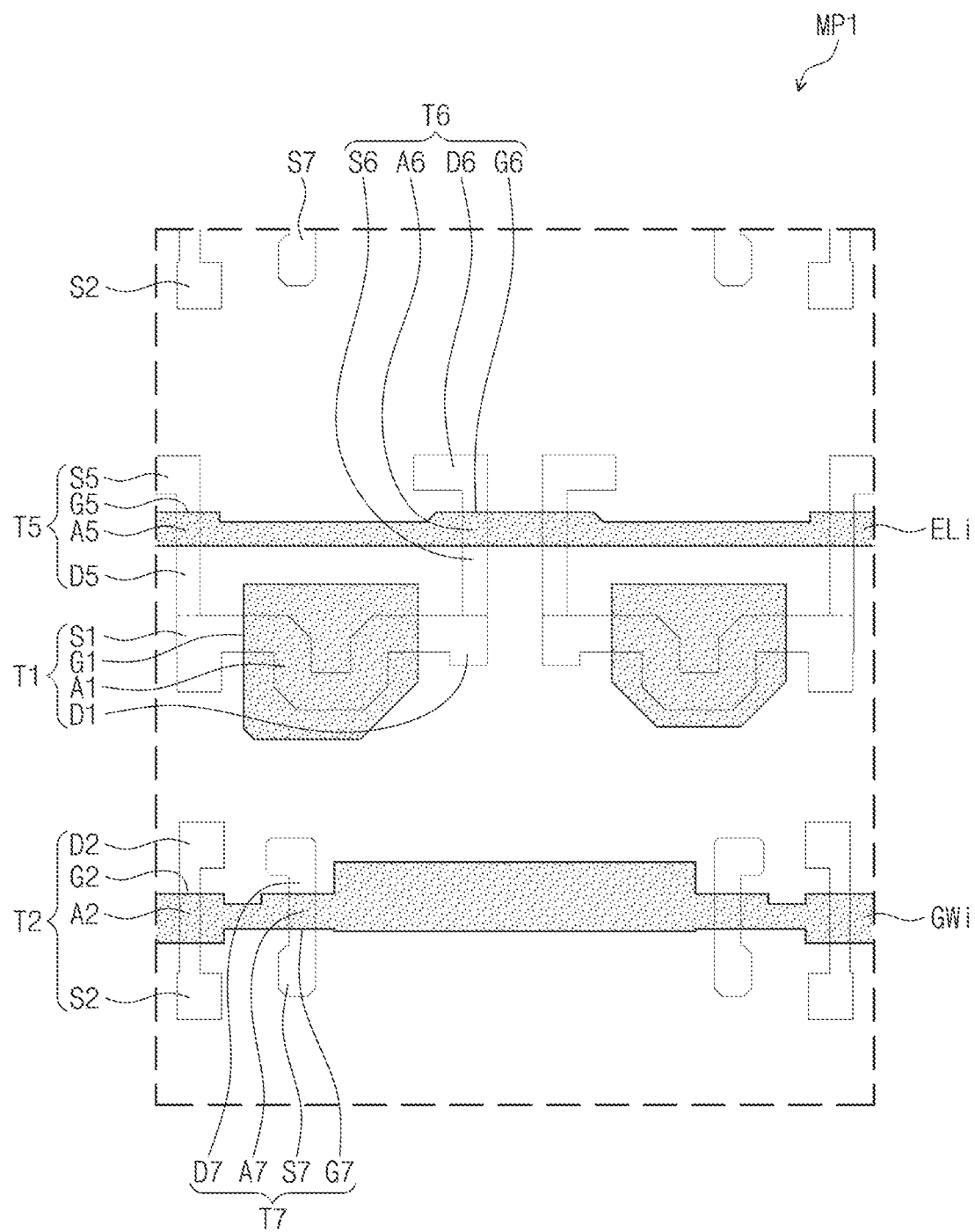

Referring to FIG. 9B, a first conductive pattern layer MP1 may be disposed on the first semiconductor pattern layer SMP1 of FIG. 9A. The first conductive pattern layer MP1 may be disposed on the first insulation layer INS1 of FIG. 8. The first conductive pattern layer MP1 may include the first gate electrode G1, the i-th light emission line ELi, and i-th write scan line GWi (or a first scan line).

The first gate electrode G1 may be disposed on the first semiconductor pattern of the first transistor T1. The first gate electrode G1 may overlap the first active region A1 on a plane.

The i-th light emission line ELi may be extended in a horizontal direction and cross the semiconductor patterns of the fifth transistor T5 and the sixth transistor T6 on a plane. A portion of the i-th light emission line ELi may be formed as the fifth gate electrode G5 of the fifth transistor T5, and another portion of the i-th light emission line ELi may be formed as the sixth gate electrode G6 of the sixth transistor T6. On a plane, portions of the i-th light emission line ELi which overlap the first semiconductor pattern layer SMP1 may be defined as the fifth and sixth gate electrodes G5 and G6. On a plane, the fifth gate electrode G5 may overlap the fifth active region A5, and the sixth gate electrode G6 may overlap the sixth active region A6.

The write scan line GWi may be extended in a horizontal direction and cross the semiconductor patterns of the second transistor T2 and the seventh transistor T7 on a plane. On a plane, portions of the i-th write scan line GWi which overlap the second and seventh semiconductor patterns of the first semiconductor pattern layer SMP1 may be respectively defined as the second and seventh gate electrodes G2 and G7. On a plane, the second gate electrode G2 may overlap the second active region A2, and the seventh gate electrode G7 may overlap the seventh active region A7.

The seventh transistor T7 illustrated in FIG. 9B may be the seventh transistor T7 of a pixel PX in the next stage. The seventh transistor T7 of the pixel PX in the next stage may be connected to the i-th write scan line GWi of a pixel PX in the current stage.

Figure 9C:
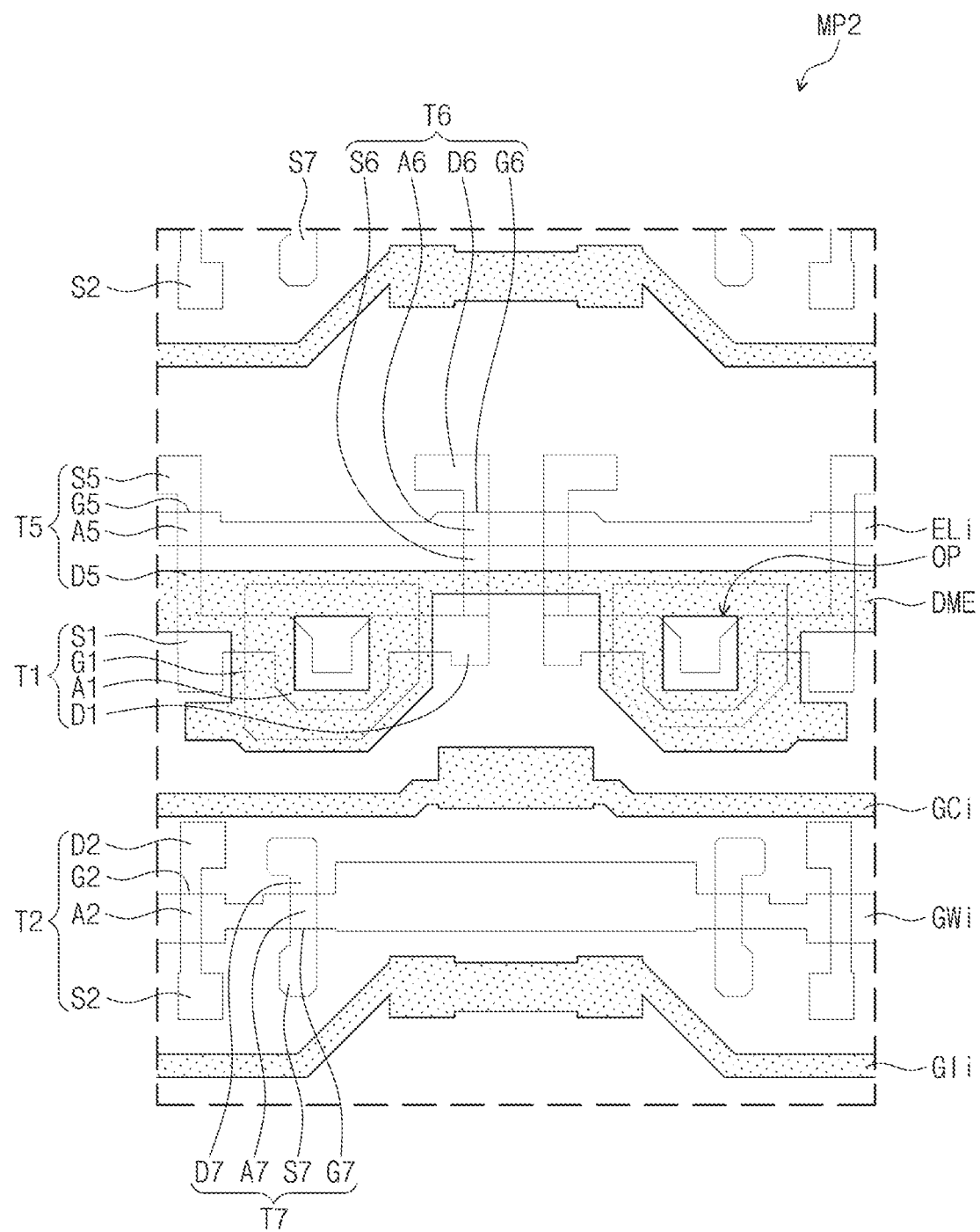

Referring to FIG. 9C, a second conductive pattern layer MP2 may be disposed on the first conductive pattern layer MP1 of FIG. 9B. The second conductive pattern layer MP2 may be disposed on the second insulation layer INS2 of FIG. 8. The second conductive pattern layer MP2 may include the upper electrode DME, the i-th compensation scan line GCi, and the i-th initialization scan line GIi.

The upper electrode DME may define an opening OP therein. The upper electrode DME may partially overlap the first gate electrode G1. By the upper electrode DME and the first gate electrode G1 which partially overlap each other, the above-described capacitor CAP may be formed.

A first capacitor electrode of the capacitor CAP (see FIG. 7) may be formed through the same process as the first gate electrode G1, and a second capacitor electrode thereof may be formed through the same process as the upper electrode DME. The first capacitor electrode of the capacitor CAP (see FIG. 7) may be electrically connected to the first gate electrode G1, and may have an integral shape with the first gate electrode G1.

The i-th compensation scan line GCi and the i-th initialization scan line GIi may each be extended in a horizontal direction. The i-th compensation scan line GCi may be connected to the third gate electrode G3 of the third transistor T3 to be described later, and the i-th initialization scan line GIi may be connected to the fourth gate electrode G4 of the fourth transistor T4 to be described later. This will be described layer with reference to FIG. 9F.

Figure 9D:
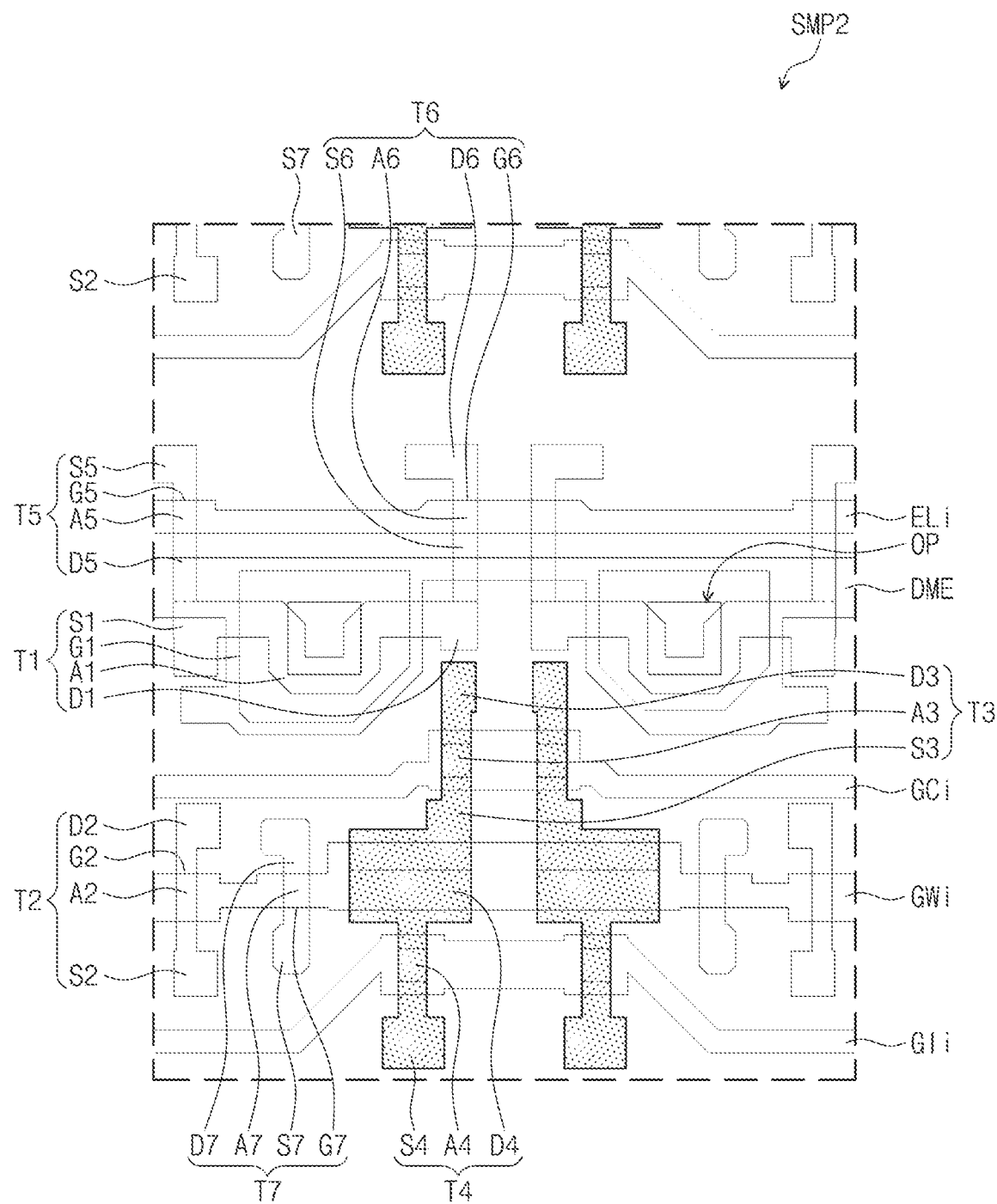

Referring to FIG. 9D, the second semiconductor pattern layer SMP2 may be disposed on the second conductive pattern layer MP2 of FIG. 9C. The second semiconductor pattern layer SMP2 may be disposed on the third insulation layer INS3 of FIG. 8. From the second semiconductor pattern layer SMP2, the third and fourth source electrodes S3 and S4, the third and fourth drain electrodes D3 and D4, and the third and fourth active regions A3 and A4 of the third and fourth transistors T3 and T4 may be formed. The third active region A3 may be disposed between the third source electrode S3 and the third drain electrodes D3, and the fourth active region A4 may be disposed between the fourth source electrode S4 and the fourth drain electrode D4.

The third semiconductor pattern of the third transistor T3 may be formed as one body with the fourth semiconductor pattern of the fourth transistor T4, on the same layer. Specifically, the fourth drain electrode D4 of the fourth transistor T4 may be extended and formed from the third source electrode S3 of the third transistor T3. The semiconductor patterns of the third and fourth transistors T3 and T4 may be formed on different layers from layers on which the semiconductor patterns of the first, second, fifth, sixth, and seventh transistors T1, T2, T5, T6, and T7 are disposed.

The third transistor T3 may cross the i-th compensation scan line GCi extended in a horizontal direction on a plane. The fourth transistor T4 may cross the i-th initialization scan line GIi extended in a horizontal direction on a plane.

Figure 9E:
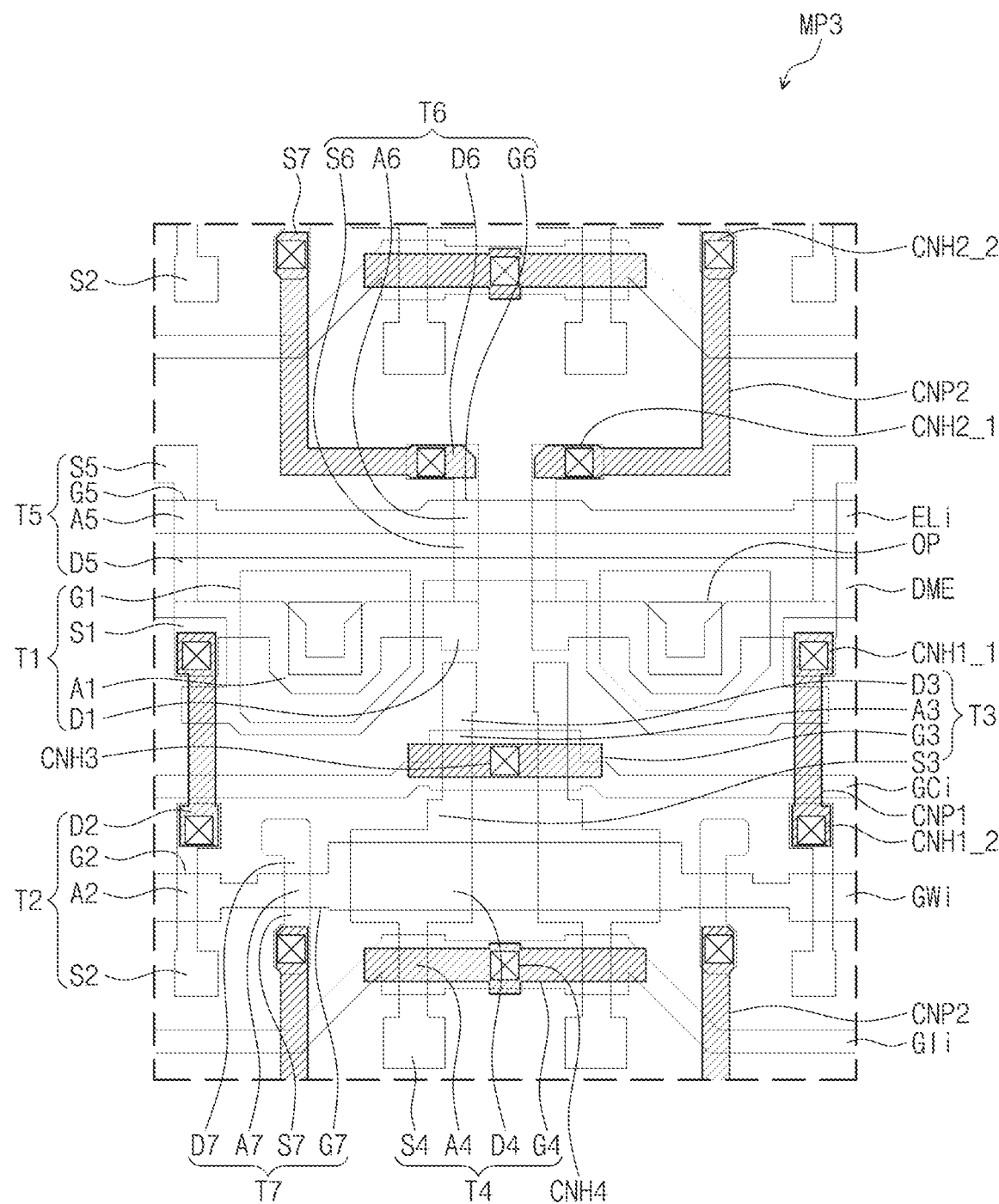

Referring to FIG. 9E, a third conductive pattern layer MP3 may be disposed on the second semiconductor pattern layer SMP2 of FIG. 9D. The third conductive pattern layer MP3 may be disposed on the fourth insulation layer INS4 of FIG. 8. The third conductive pattern layer MP3 may include the third gate electrode G3, the fourth gate electrode G4, and the connection patterns CNP1 and CNP2.

The third gate electrode G3 may be disposed on the third semiconductor pattern of the third transistor T3. The third gate electrode G3 may cross the third semiconductor pattern of the third transistor T3 on a plane. The third gate electrode G3 may overlap the third active region A3 of the third transistor T3.

A portion of the third gate electrode G3 which does not overlap the third semiconductor pattern of the third transistor T3 may overlap the i-th compensation scan line GCi formed during the forming step of the second conductive pattern layer MP2 on a plane. The third gate electrode G3 may be connected to the i-th compensation scan line GCi through a third connection contact hole CNH3.

The fourth gate electrode G4 may be disposed on the fourth semiconductor pattern of the fourth transistor T4. The fourth gate electrode G4 may cross the fourth semiconductor pattern of the fourth transistor T4 on a plane. The fourth gate electrode G4 may overlap the fourth active region A4 of the fourth transistor T4.

A portion of the fourth gate electrode G4 which does not overlap the fourth semiconductor pattern of the fourth transistor T4 may overlap the i-th initialization scan line GIi formed during the forming step of the second conductive pattern layer MP2 on a plane. The fourth gate electrode G4 may be connected to the i-th initialization scan line GIi through a fourth connection contact hole CNH4.

In an embodiment, the connection patterns CNP1 and CNP2 may include a first connection pattern CNP1 and a second connection pattern CNP2.

The first connection pattern CNP1 may be extended in a direction toward the second drain electrode D2 from the first source electrode S1 on a plane. The first connection pattern CNP1 may overlap, on a plane, the first source electrode S1 of the first transistor T1 and the second drain electrode D2 of the second transistor T2. The first connection pattern CNP1 may be connected to the first source electrode S1 and to the second drain electrode D2 through first connection contact holes CNH1_1 and CNH1_2. Accordingly, the first connection pattern CNP1 may electrically connect the first source electrode S1 of the first transistor T1 and the second drain electrode D2 of the second transistor T2 to each other.

The second connection pattern CNP2 may be extended in a direction toward the seventh source electrode S7 from the sixth drain electrode D6 on a plane. The second connection pattern CNP2 may overlap, on a plane, the sixth drain electrode D6 of the sixth transistor T6 and the seventh source electrode S7 of the seventh transistor T7. The second connection pattern CNP2 may be connected to the sixth drain electrode D6 and to seventh source electrode S7 through second connection contact holes CNH2_1 and CNH2_2. Accordingly, the second connection pattern CNP2 may electrically connect the sixth drain electrode D6 of the sixth transistor T6 and the seventh source electrode S7 of the seventh transistor T7.

The first and second connection patterns CNP1 and CNP2 may include the same materials as the third and fourth gate electrodes G3 and G4. The first and second connection patterns CNP1 and CNP2 may be formed through the same process as the third and fourth gate electrodes G3 and G4. Accordingly, the first and second connection patterns CNP1 and CNP2 may be formed without adding a process step. However, the embodiment of the invention is not limited thereto. The first and second connection patterns CNP1 and CNP2 may be formed through a process separate from the process of forming the third and fourth gate electrodes G3 and G4.

The first and second connection patterns CNP1 and CNP2 may include a conductive material. In an embodiment, for example, the first and second connection patterns CNP1 and CNP2 may include a metal material such as molybdenum, aluminum, copper, or an alloy thereof. However, the material of the first and second connection patterns CNP1 and CNP2 is not limited thereto.

The connection patterns CNP1 and CNP2 may have a higher rigidity than a semiconductor pattern. Therefore, compared to the semiconductor pattern, the connection patterns CNP1 and CNP2 may not be easily damaged by an external impact and stress which is applied by folding. The semiconductor pattern extended in one direction may be relatively vulnerable to an external impact or stress which is caused by folding. However, since the connection patterns CNP1 and CNP2 are disposed above the semiconductor pattern layer, damage to the semiconductor pattern and the disconnection of transistors caused by the damage to the semiconductor pattern which may cause a pixel PX to be improperly driven, may be reduced or effectively prevented.

If a portion extended from the first semiconductor pattern of the first transistor T1 and integrally connected to the second semiconductor pattern of the second transistor T2 is broken by a crack, there may be a problem in that a data voltage is not applied to the second transistor T2 and a light emission element OLED continuously emits light. If a portion extended from the sixth semiconductor pattern of the sixth transistor T6 and integrally connected to the seventh semiconductor pattern of the seventh transistor T7 is broken by a crack, there may be a problem in that an initialization voltage applied through the seventh transistor T7 is not applied and a weak point phenomenon occurs in a display panel DP. However, the connection patterns CNP1 and CNP2 have a robust structure which prevents the connection patterns CNP1 and CNP2 from being easily damaged even by an external impact or stress which is caused by folding, so that an underlying layer such as patterns of transistors may be stably connected to drive pixels PX normally.

Figure 9F:
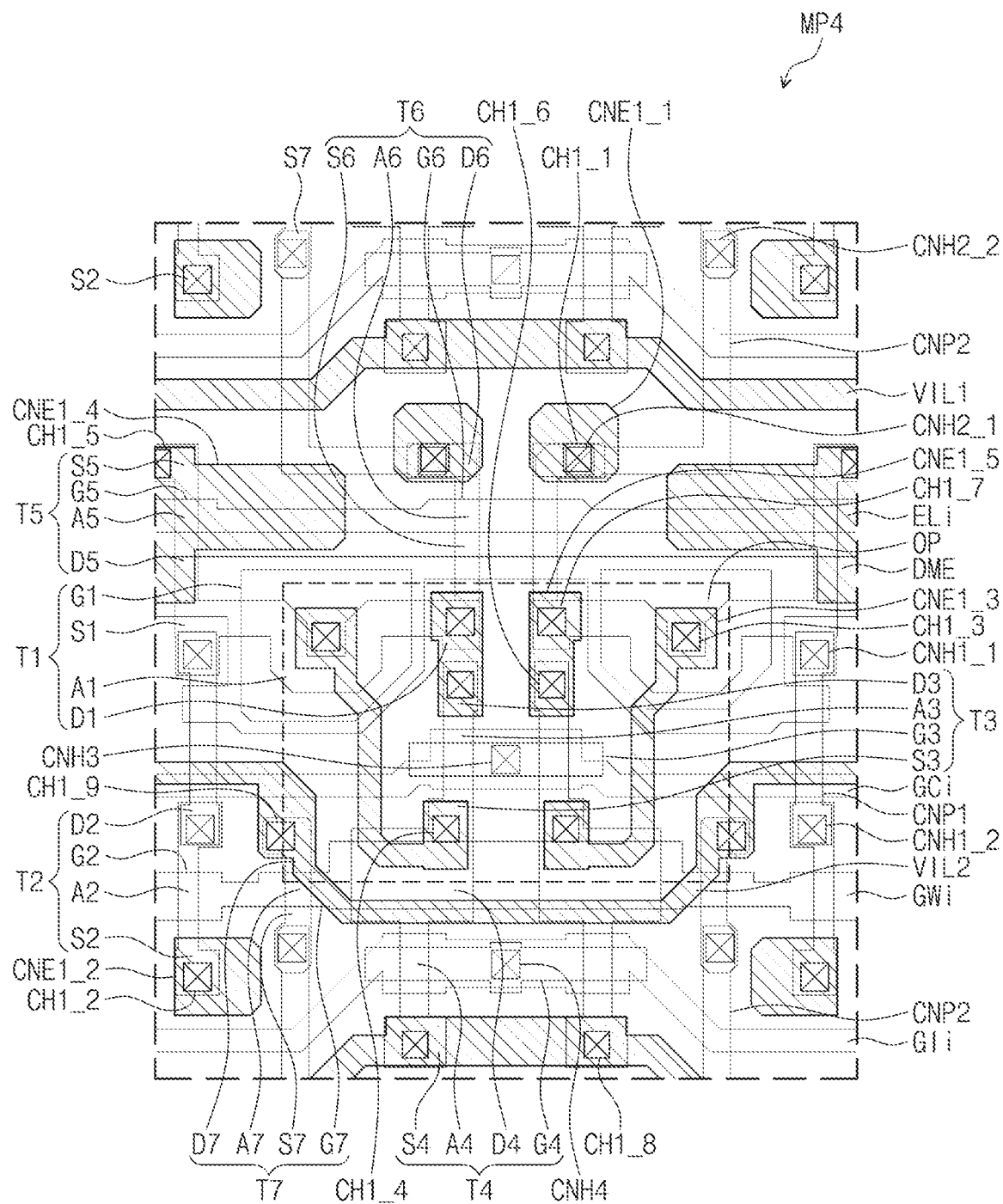

Referring to FIG. 9F, a fourth conductive pattern layer MP4 may be disposed on the third conductive pattern layer MP3 of FIG. 9E. The fourth conductive pattern layer MP4 may be disposed on the fifth insulation layer INS5 of FIG. 8. The fourth conductive pattern layer MP4 may include the first initialization line VIL1, the second initialization line VIL2, and a plurality of first connection electrodes CNE1_1, CNE1_2, CNE1_3, CNE1_4, and CNE1_5.

The first initialization line VIL1 may be extended in a horizontal direction and cross the fourth semiconductor pattern of the fourth transistor T4 on a plane. The first initialization line VIL1 may overlap the fourth source electrode S4 of the fourth transistor T4 on a plane. The first initialization line VIL1 may be connected to the fourth source electrode S4 through a contact hole CH1_8.

The second initialization line VIL2 may be extended in a horizontal direction and cross the seventh semiconductor pattern of the seventh transistor T7 on a plane. The second initialization line VIL2 may overlap the seventh drain electrode D7 of the seventh transistor T7 on a plane. The second initialization line VIL2 may be connected to the seventh drain electrode D7 through a contact hole CH1_9.

The plurality of first connection electrodes CNE1_1, CNE1_2, CNE1_3, CNE1_4, and CNE1_5 may be formed spaced apart from each other on a plane. The plurality of first connection electrodes CNE1_1, CNE1_2, CNE1_3, CNE1_4, and CNE1_5 may together form a connection electrode layer. Hereinafter, the plurality of first connection electrodes CNE1_1, CNE1_2, CNE1_3, CNE1_4, and CNE1_5 will be respectively referred to as 1_1, 1_2, 1_3, 1_4, and 1_5 connection electrodes in order to distinguish the same from each other.

The 1_1 connection electrode CNE1_1 may be connected to the second connection pattern CNP2 through a contact hole CH1_1. The 1_1 connection electrode CNE1_1 may be connected to the second connection pattern CNP2 to be electrically connected to the sixth drain electrode D6 of the sixth transistor T6. However, the embodiment of the invention is not limited thereto. The 1_1 connection electrode CNE1_1 may be directly connected to the sixth drain electrode D6 through a contact hole.

The 1_2 connection electrode CNE1_2 may be connected to the second source electrode S2 of the second transistor T2 through a contact hole CH1_2. Thereafter, the 1_2 connection electrode CNE1_2 may be electrically connected to the data line DLj to be described later.

The 1_3 connection electrode CNE1_3 may be connected to the first gate electrode G1 of the first transistor T1 and to the third source electrode S3 of the third transistor T3 through contact holes CH1_3 and CH1_4. The contact holes CH1_3 may be formed overlapping the opening OP defined in the upper electrode DME and the 1_3 connection electrode CNE1_3, and accordingly, the 1_3 connection electrode CNE1_3 may be connected to the first gate electrode G1.

The 1_4 connection electrode CNE1_4 may be connected to the fifth source electrode S5 of the fifth transistor T5 through a contact hole CH1_5. Thereafter, the 1_4 connection electrode CNE1_4 may be electrically connected to the first power line PL1 to be described later.

The 1_5 connection electrode CNE1_5 may be connected to the first drain electrode D1 of the first transistor T1 and to the third drain electrode D3 of the third transistor T3 through contact holes CH1_6 and CH1_7. The 1_5 connection electrode CNE1_5 may electrically connect the first transistor T1 and the third transistor T3.

Figure 9G:
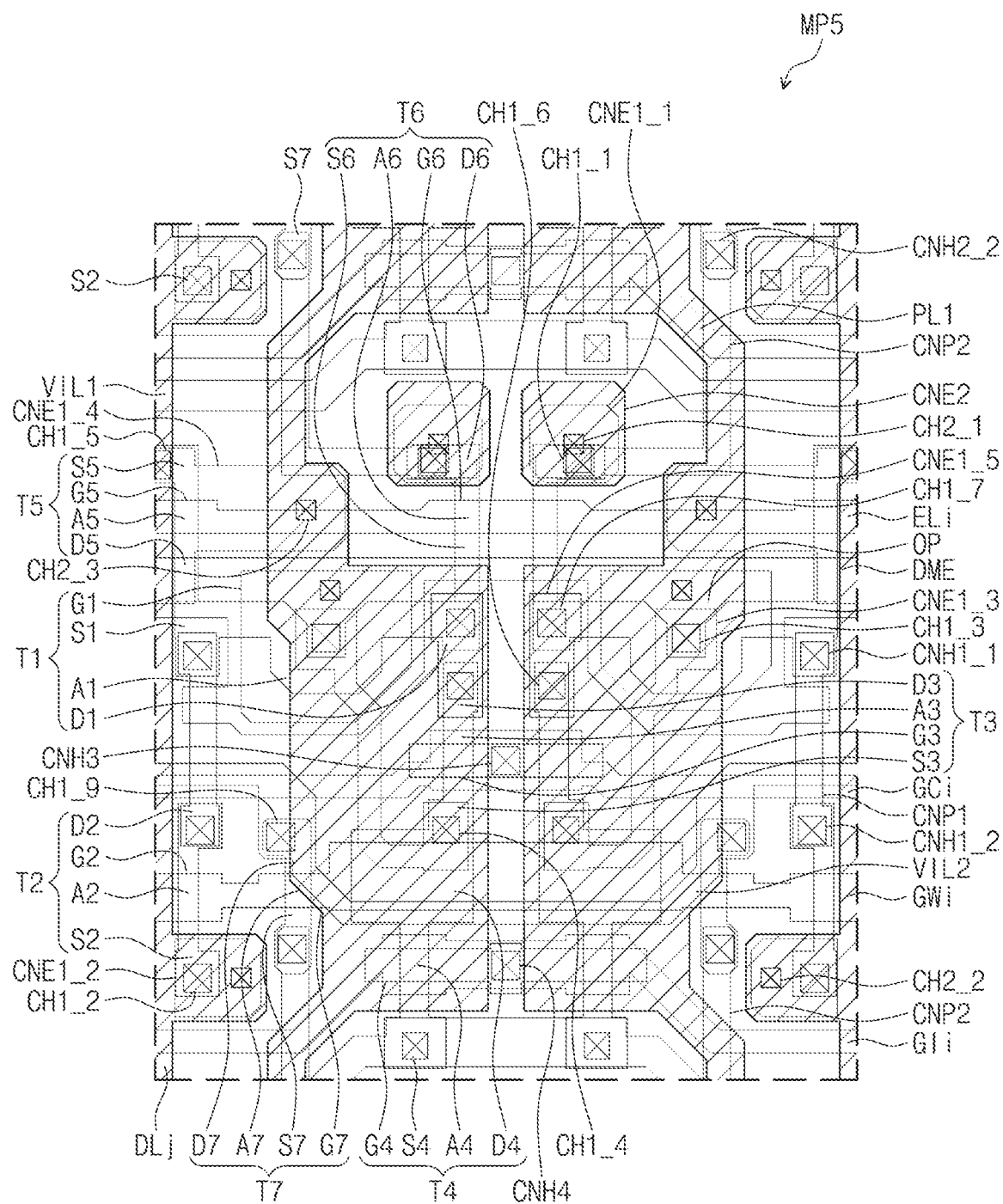

Referring to FIG. 9G, a fifth conductive pattern layer MP5 may be disposed on the fourth conductive pattern layer MP4 of FIG. 9F. The fifth conductive pattern layer MP5 may be disposed on the sixth insulation layer INS6 of FIG. 8. The fifth conductive pattern layer MP5 may include the first power line PL1, the data line DLj, and the second connection electrode CNE2.

The second connection electrode CNE2, the first power line PL1, and the data line DLj may be disposed on the same layer with each other. The second connection electrode CNE2, the first power line PL1, and the data line DLj may include the same material, and may be formed by patterning the same conductive layer.

The first power line PL1 which receives the first voltage ELVDD (see FIG. 7) may be electrically connected to the 1_5 connection electrode CNE1_5 and to the upper electrode DME through a contact hole CH2_3. Accordingly, the first power line PL1 may be electrically connected to each of the fifth source electrode S5 of the fifth transistor T5 and the capacitor CAP (see FIG. 7).

The data line DLj may be extended in a vertical direction, and may be electrically connected to the 1_2 connection electrode CNE1_2 through the contact hole CH2_2. Accordingly, the data line DLj may be electrically connected to the second source electrode S2 of the second transistor T2.

The second connection electrode CNE2 may be electrically connected to the 1_1 connection electrode CNE1_1 through a contact hole CH2_1. As illustrated in FIG. 8, the second connection electrode CNE2 may be electrically connected to the first electrode AE of the light emission element OLED. Accordingly, the sixth drain electrode D6 of the sixth transistor T6 may be electrically connected to the first electrode AE (see FIG. 8) of the light emission element OLED (see FIG. 8).

The patterns constituting the pixel PXij which are illustrated in FIG. 9A to FIG. 9G are only exemplary. The shapes of patterns constituting the pixel PXij are not necessarily limited thereto.

Figure 10:
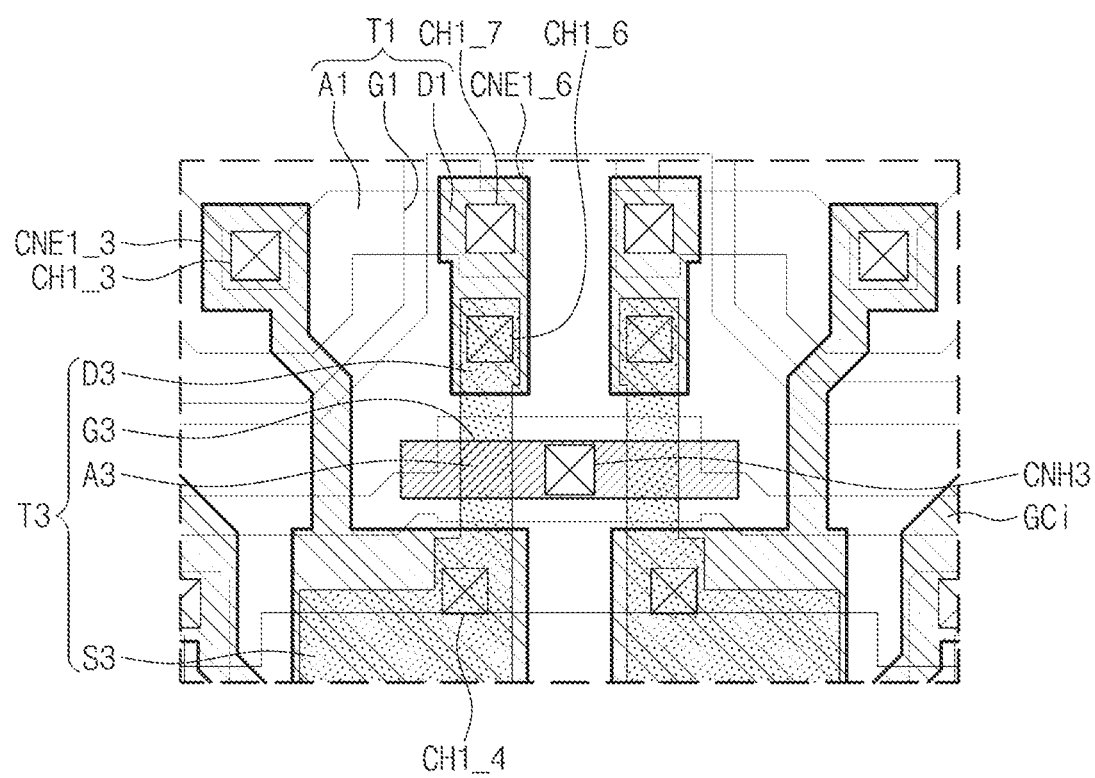
FIG. 10 is a plan view illustrating patterns of a pixel according to an embodiment.

FIG. 10 is a plane view of an enlarged region of FIG. 9F, which is indicated by the dotted line box in FIG. 9F. FIG. 10 illustrates an enlarged portion corresponding to the 1_3 connection electrode CNE1_3. The 1_3 connection electrode CNE1_3 of an embodiment illustrated in FIG. 10 substantially has the same configuration as the 1_3 connection electrode CNE1_3 illustrated in FIG. 9F with some differences in shape.

As illustrated in FIG. 9F, on a plane, a portion of the third source electrode S3 of the third transistor T3 may not overlap the 1_3 connection electrode CNE1_3 depending on the shape of the 1_3 connection electrode CNE1_3. As illustrated in FIG. 10, the 1_3 connection electrode CNE1_3 of an embodiment may extend a portion of the 1_3 connection electrode CNE1_3 corresponding to the third source electrode S3 to cover an entire area of the third source electrode S3. On a plane, the 1_3 connection electrode CNE1_3 may substantially overlap the entire area of the third source electrode S3.

A 1_6 connection electrode CNE1_6 may be disposed to cover a region corresponding to the third drain electrode D3 on a plane. On a plane, the 1_6 connection electrode CNE1_6 may substantially overlap an entire area of the third drain electrode D3.

The third semiconductor pattern of the third transistor T3 may overlap, on a plane, the first connection electrodes CNE1_3 and CNE1_6, the i-th compensation scan line GCi, and the third gate electrode G3 which have a higher rigidity than the third semiconductor pattern. As a result, the third transistor T3 including the third semiconductor pattern may be protected from an external impart or stress which is caused by folding, and may be prevented from being damaged.

Figure 11A:
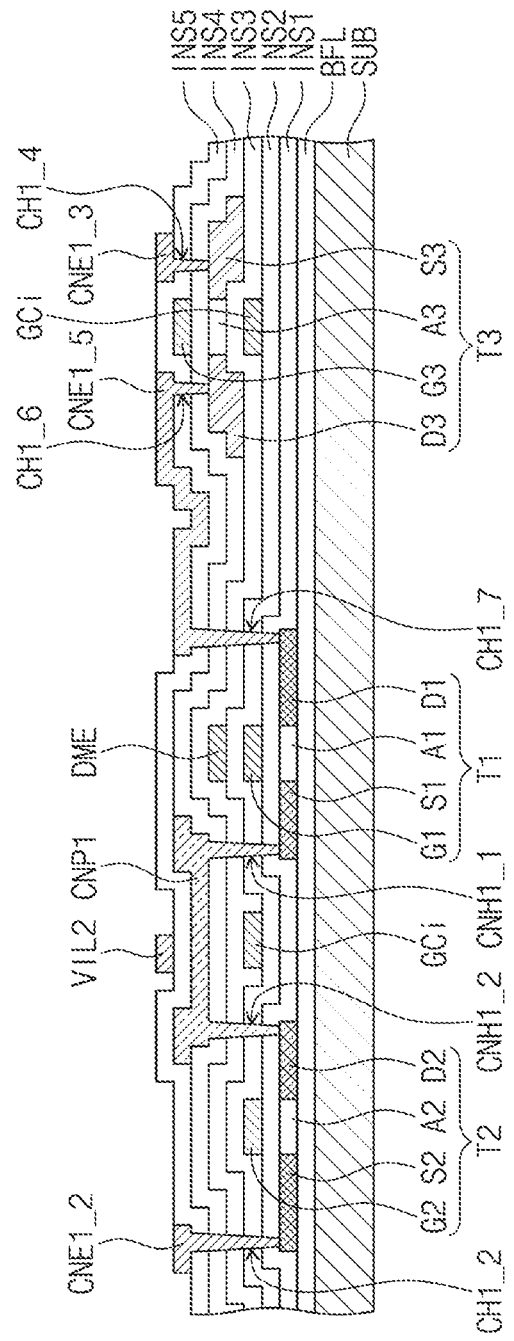
FIG. 11A to FIG. 11C are cross-sectional views illustrating some components of a circuit element layer according to an embodiment.
Figure 11B:
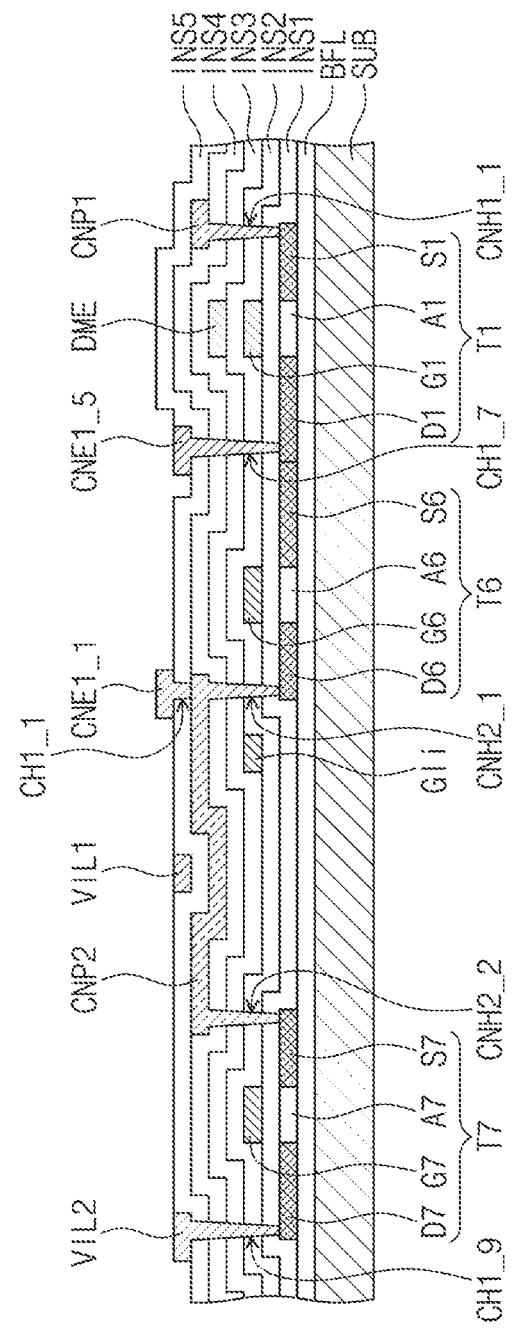
Figure 11C:
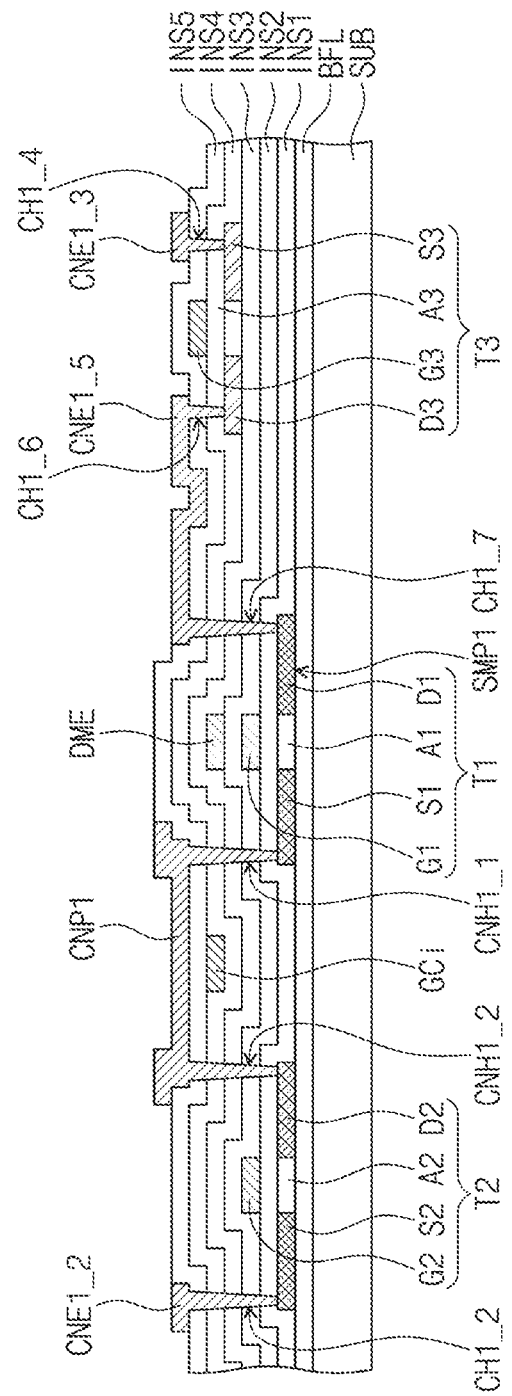

FIG. 11A to FIG. 11C are cross-sectional views illustrating some components of a circuit element layer DP-CL according to an embodiment of the invention. FIG. 11A to FIG. 11C illustrate cross-sections in which the first semiconductor pattern layer SMP1 (see FIG. 9A) to the fourth conductive pattern layer MP4 (see FIG. 9F) are stacked on the base substrate SUB. FIG. 11A to FIG. 11C exemplarily illustrate a cross-section of a first connection pattern CNP1, and FIG. 11B exemplarily illustrates a cross-section of a second connection pattern CNP2.

Referring to FIG. 11A, the first semiconductor pattern of the first transistor T1 and the second semiconductor pattern of the second transistor T2 may be disposed on the same layer, which is on the buffer layer BFL. The first semiconductor pattern may include the first source electrode S1, the first active region A1, and the first drain electrode D1. The second semiconductor pattern may include the second source electrode S2, the second active region A2, and the second drain electrode D2.

The first insulation layer INS1 may be disposed on the first semiconductor pattern and on the second semiconductor pattern. The first gate electrode G1 and the second gate electrode G2 may be disposed on the first insulation layer INS1. The first gate electrode G1 may overlap the first active region A1, and the second gate electrode G2 may overlap the second active region A2.

The second insulation layer INS2 may be disposed on the first insulation layer INS1 to cover the first and second gate electrodes G1 and G2. The upper electrode DME may be disposed on the second insulation layer INS2. The upper electrode DME and the first gate electrode G1 may together form the capacitor CAP described above. The first capacitor electrode of the capacitor CAP may be formed as one body with the first gate electrode G1, on the same layer. The first capacitor electrode of the capacitor CAP may overlap the first semiconductor pattern on a plane to include a first portion defining the first gate electrode G1 and a second portion overlapping the upper electrode DME on a plane. The upper electrode DME may be defined as a second electrode of the capacitor CAP.

The i-th compensation scan line GCi may be disposed on the second insulation layer INS2. The i-th compensation scan line GCi may be formed through the same process as the upper electrode DME, and may be disposed on the same layer as a layer on which the upper electrode DME is disposed. The i-th compensation scan line GCi may be disposed between the first transistor T1 and the second transistor T2 on a plane and extended in one direction. However, the embodiment of the invention is not limited thereto.

The third insulation layer INS3 may be disposed on the second insulation layer INS2 to cover the upper electrode DME and the i-th compensation scan line GCi. The third semiconductor pattern of the third transistor T3 may be disposed on the third insulation layer INS3. The third semiconductor pattern may include the third source electrode S3, the third active region A3, and the third drain electrode D3.

The third semiconductor pattern of the third transistor T3 may be disposed on a different layer from a layer on which the first semiconductor pattern of the first transistor T1 is disposed. In an embodiment, the third semiconductor pattern may be disposed above the first semiconductor pattern, that is, further from the base substrate than the first semiconductor pattern. However, the embodiment of the invention is not limited thereto.

The fourth insulation layer INS4 may be disposed on the third semiconductor pattern. The third gate electrode G3 may be disposed on the fourth insulation layer INS4. The third gate electrode G3 may overlap the third active region A3.

The first connection pattern CNP1 may be disposed on the fourth insulation layer INS4. The first connection pattern CNP1 may be disposed on the same layer as a layer on which the third gate electrode G3 is disposed. The first connection pattern CNP1 may be formed through the same process as a process by which the third gate electrode G3 is formed, and may include the same material. However, the embodiment of the invention is not limited thereto.

The first connection pattern CNP1 may be connected to the first source electrode S1 and the second drain electrode D2 respectively through the first connection contact holes CNH1_1 and CNH1_2 passing through the first to fourth insulation layers INS1 to INS4. Accordingly, the first connection pattern CNP1 may electrically connect the first transistor T1 and the second transistor T2 to each other. The first connection pattern CNP1 may cross a portion of the i-th compensation scan line GCi disposed between the first transistor T1 and the second transistor T2 on a plane.

The first source electrode S1 and the second drain electrode D2 may be connected to each other by extending a semiconductor pattern. In this case, the semiconductor pattern which is relatively vulnerable to an impact may be cracked by an external impact or stress which is caused by folding, and due to the damage to a transistor, a pixel PX may not be driven normally. However, since the first connection pattern CNP1 which has relatively greater rigidity than the semiconductor pattern is disposed, transistors may be connected to each other without connecting the transistors by extending the semiconductor pattern, and a problem of semiconductor pattern damage may be prevented.

The fifth insulation layer INS5 may be disposed on the fourth insulation layer INS4 to cover the first connection pattern CNP1 and the third gate electrode G3. A plurality of first connection electrodes CNE1_2, CNE1_3, and CNE1_5 and the second initialization line VIL2 may be disposed on the fifth insulation layer INS5.

The second initialization line VIL2 may cross the first connection pattern CNP1 on a plane. The second initialization line VIL2 may be electrically connected to the seventh transistor T7 (see FIG. 9F) to provide the initialization voltage.

The 1_2 connection electrode CNE1_2 may be connected to the second source electrode S2 through the contact hole CH1_2 passing through the first to fifth insulation layers INS1 to INS5. The 1_2 connection electrode CNE1_2 may be an electrode connected to the data line DLj (see FIG. 9G) which receives a data voltage.

The 1_3 connection electrode CNE1_3 may be connected to the third source electrode S3 through the contact hole CH1_4 passing through the fourth and fifth insulation layers INS4 and INS5. Although not illustrated in FIG. 11A, the 1_3 connection electrode CNE1_3 may be connected to the first gate electrode G1 via the opening OP of the upper electrode DME.

The 1_5 connection electrode CNE1_5 may be connected to the third drain electrode D3 through the contact hole CH1_6 passing through the fourth and fifth insulation layers INS4 and INS5. The 1_5 connection electrode CNE1_5 may be connected to the first drain electrode D1 through the contact hole CH1_7 passing through the first to fifth insulation layers INS1 to INS5. The 1_5 connection electrode CNE1_5 may connect the first transistor T1 to the transistor T3 which are disposed on different layers from each other.

Referring to FIG. 11B, semiconductor patterns of the first, sixth, and the seventh transistors T1, T6, and T7 may be disposed on the same layer, which is on the buffer layer BFL. The sixth semiconductor pattern may include the sixth source electrode S6, the sixth active region A6, and the sixth drain electrode D6. The seventh semiconductor pattern may include the seventh source electrode S7, the seventh active region A7, and the seventh drain electrode D7.

The first semiconductor pattern and the sixth semiconductor pattern may be formed as one body and connected to each other, on the buffer layer BFL. The first drain electrode D1 and the sixth source electrode S6 may be formed as one body and electrically connected to each other. At least a portion of the first drain electrode D1 and the sixth source electrode S6 formed as one body may overlap conductive patterns disposed above the portion and on a different layer, and thus, damage due to cracks may be prevented.

The first insulation layer INS1 may be disposed on the first, sixth, and seventh semiconductor patterns. The first, sixth, and seventh gate electrodes G1, G6, and G7 may be disposed on the first insulation layer INS1. The first, sixth, and seventh gate electrodes G1, G6, and G7 may respectively overlap the first, sixth, and seventh active regions A1, A6, and A7.

The second insulation layer INS2 may be disposed on the first insulation layer INS1 to cover the first, sixth, and seventh gate electrodes G1, G6, and G7. The upper electrode DME may be disposed on the second insulation layer INS2.

The i-th initialization scan line GIi may be disposed on the second insulation layer INS2. The i-th initialization scan line GIi may be formed through the same process as the upper electrode DME, and may be disposed on the same layer as a layer on which the upper electrode DME is disposed. The i-th initialization scan line GIi may be disposed between the sixth transistor T6 and the seventh transistor T7 on a plane and extended in one direction. However, the embodiment of the invention is not limited thereto.

The third insulation layer INS3 may be disposed on the second insulation layer INS2 to cover the upper electrode DME and the i-th initialization scan line GIi. The fourth insulation layer INS4 may be disposed on the third insulation layer INS3. Although not illustrated in FIG. 11B, semiconductor patterns of the third transistor T3 and the fourth transistor T4 may be disposed between the third insulation layer INS3 and the fourth insulation layer INS4.

The second connection pattern CNP2 may be disposed on the fourth insulation layer INS4. The second connection pattern CNP2 may be disposed on the same layer as a layer on which the first connection pattern CNP1 is disposed. The second connection pattern CNP2 may include the same material layer as the first connection pattern CNP1. However, the embodiment of the invention is not limited thereto.

The second connection pattern CNP2 may be connected to the sixth drain electrode D6 and the seventh source electrode S7 respectively through the second connection contact holes CNH2_1 and CNH2_2 passing through the first to fourth insulation layers INS1 to INS4. Accordingly, the second connection pattern CNP2 may electrically connect the sixth transistor T6 to the seventh transistor T7. The second connection pattern CNP2 may cross a portion of the i-th initialization scan line GIi disposed between the sixth transistor T6 and the seventh transistor T7 on a plane.

The sixth drain electrode D6 and the seventh source electrode S7 may be connected to each other by extending a semiconductor pattern. In this case, the semiconductor pattern which is relatively vulnerable to an impact may be damaged by an external impact or stress, so that a pixel PX may not be driven normally. However, since the second connection pattern CNP2 which has relatively greater rigidity than the semiconductor pattern is disposed, transistors may be connected without connecting the transistors by extending the semiconductor pattern, and a problem of semiconductor pattern damage may be prevented.

The fifth insulation layer INS5 may be disposed on the fourth insulation layer INS4 to cover the first connection pattern CNP1 and the second connection pattern CNP2. A plurality of first connection electrodes CNE1_1 and CNE1_5, and the first and second initialization lines VIL1 and VIL2 may be disposed on the fifth insulation layer INS5.

The first initialization line VIL1 may be electrically connected to the fourth transistor T4 (see FIG. 9F) to provide the initialization voltage. The first initialization line VIL1 may be disposed between the sixth transistor T6 and the seventh transistor T7 on a plane and extended in one direction. The first initialization line VIL1 may cross the second connection pattern CNP2 on a plane. However, the embodiment of the invention is not limited thereto.

The second initialization line VIL2 may be connected to the seventh drain electrode D7 of the seventh transistor T7 through the contact hole CH1_9 passing through the first to fifth insulation layers INS1 to INS5. The second initialization line VIL2 may be electrically connected to the seventh transistor T7 to provide the initialization voltage.

The 1_1 connection electrode CNE1_1 may be connected to the second connection pattern CNP2 through the contact hole CH1_1 passing through the fifth insulation layer INS5, and may be electrically connected to the sixth drain electrode D6. The 1_1 connection electrode CNE1_1 may be connected to the first electrode AE (see FIG. 8) of the light emission element OLED (see FIG. 8) disposed on the 1_1 connection electrode CNE1_1.

The 1_5 connection electrode CNE1_5 may be connected to the first drain electrode D1 through the contact hole CH1_7 passing through the first and fifth insulation layers INS1 and INS5. The 1_5 connection electrode CNE1_5 may electrically connect the first transistor T1 to the third transistor T3 (see FIG. 11B).

The components illustrated in FIG. 11C are substantially the same as the components illustrated in FIG. 11A, and the above-described description may be equally applied thereto with some differences in a layer on which the first connection pattern CNP1 is formed. Hereinafter, a description will be given with a focus on the differences.

The first connection pattern CNP1 may be disposed on the fifth insulation layer INS5. The first connection pattern CNP1 may be disposed on the same layer as a layer on which the first connection electrodes CNE1_2, CNE1_3, and CNE1_5 are disposed. The first connection pattern CNP1 may be formed through the same process as a process by which the first connection electrodes CNE1_2, CNE1_3, and CNE1_5 are formed, and may include the same material. However, the embodiment of the invention is not limited thereto. Similar to that shown for the first connection pattern CNP1 in FIG. 11C, the second connection pattern CNP2 of FIG. 11B may also be disposed on the fifth insulation layer INS5, and formed through the same process as a process by which the first connection electrodes CNE1_2, CNE1_3, and CNE1_5 are formed.

The first connection pattern CNP1 may be connected to the first source electrode S1 and the second drain electrode D2 respectively through the first connection contact holes CNH1_1 and CNH1_2 passing through the first to fifth insulation layers INS1 to INS5. Accordingly, the first connection pattern CNP1 may electrically connect the first transistor T1 and the second transistor T2.

In an embodiment in which the first connection pattern CNP1 and connection electrodes are formed thorough the same process, a portion of the i-th compensation scan line GCi may be formed as the third gate electrode G3. In this case, the i-th compensation scan line GCi may be disposed on the fourth insulation layer INS4 and overlap the third semiconductor pattern on a plane. Accordingly, the portion of the i-th compensation scan line GCi overlapping the third semiconductor pattern may be defined as the third gate electrode G3.

The cross-sections of the circuit element layer DP-CL illustrated in FIG. 11A to FIG. 11C are exemplary, and the shape of a cross-section of the circuit element layer DP-CL is not necessarily limited to the one illustrated.

A display panel DP according to an embodiment may include a connection pattern which connects semiconductor patterns of transistors formed on the same layer. The connection pattern may include a material with a higher rigidity than the underlying semiconductor pattern, and may prevent the underlying semiconductor pattern from being damaged due to an external impact or stress which is applied by folding. Through the above, a phenomenon in which the transistors of the display panel DP are disconnected may be prevented, and a pixel PX may be normally driven.

Transistors according to an embodiment of the invention include a conductive connection pattern configured to connect adjacent semiconductor patterns to each other. Thus, the overlying conductive connection pattern may prevent cracks from generating in the transistors by external impacts or stress which is caused by folding of the electronic device, and prevent the transistors from being damaged, so that pixels PX may operate normally.

Although the invention has been described with reference to embodiments of the invention, it will be understood by those skilled in the art that various modifications and changes in form and details may be made therein without departing from the spirit and scope of the invention as set forth in the following claims.

Accordingly, the technical scope of the invention is not intended to be limited to the contents set forth in the detailed description of the specification, but is intended to be defined by the appended claims.

What is claimed is:

1. An electronic device comprising:
a display panel;
a folding axis about which the display panel is foldable;
a circuit element layer which is foldable about the folding axis, the circuit element layer including:
a plurality of transistors including:
a first transistor including a first semiconductor pattern;
a second transistor electrically connected to the first transistor and including a second semiconductor pattern; and
the first semiconductor pattern and the second semiconductor pattern on the same layer of the circuit element layer,
a connection pattern which is in a same material layer and extends continuously between the first semiconductor pattern and the second semiconductor pattern to electrically connect the first transistor and the second transistor to each other, and
the connection pattern on a different layer of the circuit element layer from the same layer on which the first semiconductor pattern and the second semiconductor pattern are disposed; and
a light emission element connected to the circuit element layer.

2. The electronic device of claim 1, wherein the connection pattern comprises molybdenum, aluminum, copper or an alloy thereof.

3. The electronic device of claim 1, wherein the circuit element layer further includes:
a capacitor including:
a first electrode on the first semiconductor pattern, and
a second electrode facing the first semiconductor pattern with the first electrode therebetween; and
the connection pattern on a different layer of the circuit element layer from layers on which the first electrode and the second electrode are disposed.

4. The electronic device of claim 3, wherein the first electrode of the capacitor comprises:
a first portion overlapping the first semiconductor pattern to define a gate electrode of the first transistor; and
a second portion overlapping the second electrode of the capacitor.

5. The electronic device of claim 1, wherein the plurality of transistors further includes a third transistor including a third semiconductor pattern on a different layer of the circuit element layer from a layer on which the first semiconductor pattern is disposed.

6. The electronic device of claim 5, wherein the circuit element layer further includes a connection electrode which is electrically connected to a source of the third semiconductor pattern of the third transistor and to a gate electrode of the first transistor.

7. The electronic device of claim 6, wherein within the circuit element layer, the connection pattern is on a different layer of the circuit element layer from a layer on which the connection electrode is disposed.

8. The electronic device of claim 6, wherein within the circuit element layer, the connection electrode overlaps an entirety of the source of the third semiconductor pattern of the third transistor.

9. The electronic device of claim 5, wherein within the circuit element layer,
the third transistor comprises a gate electrode overlapping the third semiconductor pattern, and
the connection pattern, and the gate electrode of the third transistor, are disposed on the same layer of the circuit element layer.

10. The electronic device of claim 9, wherein the circuit element layer further includes:
a signal line connected to the gate electrode of the third transistor, and
the signal line crossing the connection pattern.

11. The electronic device of claim 5, wherein within the plurality of transistors, each of the first semiconductor pattern, the second semiconductor pattern and the third semiconductor pattern comprises polysilicon or a metal oxide.

12. The electronic device of claim 1, wherein the circuit element layer further includes:
the plurality of transistors further including:
a third transistor including a third semiconductor pattern;
a fourth transistor electrically connected to the third transistor and including a fourth semiconductor pattern; and
the third semiconductor pattern and the fourth semiconductor pattern on the same layer of the circuit element layer,
the connection pattern defining a first connection pattern extending continuously between the first semiconductor pattern and the second semiconductor pattern to connect the first transistor and the second transistor to each other; and
a second connection pattern connecting the third semiconductor pattern and the fourth semiconductor pattern to each other.

13. The electronic device of claim 12, wherein
the light emission element which is connected to the circuit element layer includes an anode and a cathode, and
the circuit element layer further includes a connection electrode which electrically connects the second connection pattern, and the anode of the light emission element, to each other.

14. The electronic device of claim 12, wherein the circuit element layer further includes:
an initialization line which is electrically connected to the fourth transistor and receives an initialization voltage, and
the initialization line crossing the second connection pattern.

15. An electronic device comprising:
a display panel comprising:
a pixel;
a scan line which provides a gate voltage to the pixel;
a data line which provides a data voltage to the pixel;
a first power line which provides a first power voltage to the pixel; and
a second power line which provides a second power voltage to the pixel,
wherein the pixel of the display panel includes:
a capacitor connected to the first power line;
a first transistor connected to the capacitor;
a second transistor connected to the first transistor, to the scan line and to the data line;

a semiconductor pattern of the first transistor and a semiconductor pattern of the second transistor on the same layer within the pixel;

a light emission element connected to the second power line; and a first connection pattern which is in a same material layer and extends continuously between the semiconductor patterns to electrically connect the first and second transistors to each other, and is on a different layer within the pixel from a layer on which the semiconductor pattern of the first transistor is disposed.

16. The electronic device of claim 15, further comprising:

a first initialization line which provides a first initialization voltage to the pixel; and a first signal line which provides a light emission control signal to the pixel, wherein the pixel further includes:

a third transistor connected to the light emission element and to the first signal line;

a fourth transistor connected to the third transistor and to the first initialization line;

a semiconductor pattern of the third transistor and a semiconductor pattern of the fourth transistor on the same layer within the pixel; and a second connection pattern which connects the semiconductor patterns of the third and fourth transistors to each other, and is on a different layer within the pixel from a layer on which the semiconductor pattern of the third transistor is disposed.

17. The electronic device of claim 16, further comprising a second initialization line which provides a second initialization voltage to the pixel, wherein the pixel further includes:

a fifth transistor connected to the first transistor and comprising a semiconductor pattern and a source;

a sixth transistor connected to the fifth transistor and to the second initialization line;

a seventh transistor connected to the first power line and to the first transistor; and a connection electrode which connects the capacitor and the fifth transistor to each other, overlaps an entirety of the source of the fifth transistor, and is on a different layer within the pixel from a layer on which the semiconductor pattern of the fifth transistor is disposed.

18. The electronic device of claim 17, wherein each of the first to the seventh transistors is an N-type transistor or a P-type transistor.

* * * * *